United States Patent
Wu et al.

(10) Patent No.: US 11,355,518 B2
(45) Date of Patent: Jun. 7, 2022

(54) SEMICONDUCTOR DEVICE HAVING BURIED BIAS PADS

(71) Applicants: TAIWAN SEMICONDUCTOR MANUFACTURING COMPANY LTD., Hsinchu (TW); TSMC CHINA COMPANY, LIMITED, Shanghai (CN)

(72) Inventors: Jian Wu, Shanghia (CN); Feng Han, Shanghai (CN); Shuai Zhang, Shanghai (CN)

(73) Assignees: TAIWAN SEMICONDUCTOR MANUFACTURING COMPANY, LTD., Hsinchu (TW); TSMC CHINA COMPANY, LIMIIED, Shanghai (CN)

( * ) Notice: Subject to any disclaimer, the term of this patent is extended or adjusted under 35 U.S.C. 154(b) by 0 days.

(21) Appl. No.: 16/936,030

(22) Filed: Jul. 22, 2020

(65) Prior Publication Data

US 2022/0013542 A1    Jan. 13, 2022

(30) Foreign Application Priority Data

Jul. 7, 2020 (CN) .......................... 202010644848.3

(51) Int. Cl.
*H01L 27/12* (2006.01)
*H01L 21/74* (2006.01)
(Continued)

(52) U.S. Cl.
CPC ........ *H01L 27/1203* (2013.01); *H01L 21/743* (2013.01); *H01L 21/84* (2013.01); *H01L 23/535* (2013.01); *H01L 27/1207* (2013.01)

(58) Field of Classification Search
CPC ... H01L 27/1203; H01L 21/743; H01L 21/84; H01L 23/535; H01L 27/1207; H01L 29/78648; H01L 27/7207
(Continued)

(56) References Cited

U.S. PATENT DOCUMENTS

2011/0175142 A1* 7/2011 Tsurumi et al. .... H01L 29/1075
257/192

FOREIGN PATENT DOCUMENTS

TW    202013695 A    4/2020
WO    2010047030 A1  4/2010

OTHER PUBLICATIONS

Office Action dated May 17, 2021 for corresponding case No. TW 11020460320. (pp. 1-5).

* cited by examiner

*Primary Examiner* — Thinh T Nguyen
(74) *Attorney, Agent, or Firm* — Hauptman Ham, LLP

(57) ABSTRACT

An integrated circuit includes a bias pad within a buried oxide layer. A layer of semiconductor material is over the buried oxide layer. The layer of semiconductor material includes a doped regions for a transistor. An inter layer dielectric (ILD) material covers the layer of semiconductor material and a gate electrode for the transistor. The integrated circuit includes one or more bias contacts extending through the ILD material within an isolation region in the layer of semiconductor material. Bias contacts electrically connect to the first bias pad. The isolation structure insulates the one or more bias contacts from the doped regions of the transistor within the layer of semiconductor material. The one or more bias contacts are electrically connected to an interconnection structure of the integrated circuit which is configured to connect a voltage source to the bias pad.

20 Claims, 23 Drawing Sheets

(51) Int. Cl.
*H01L 21/84* (2006.01)
*H01L 23/535* (2006.01)

(58) Field of Classification Search
USPC .......................... 257/347, 349; 438/152, 155
See application file for complete search history.

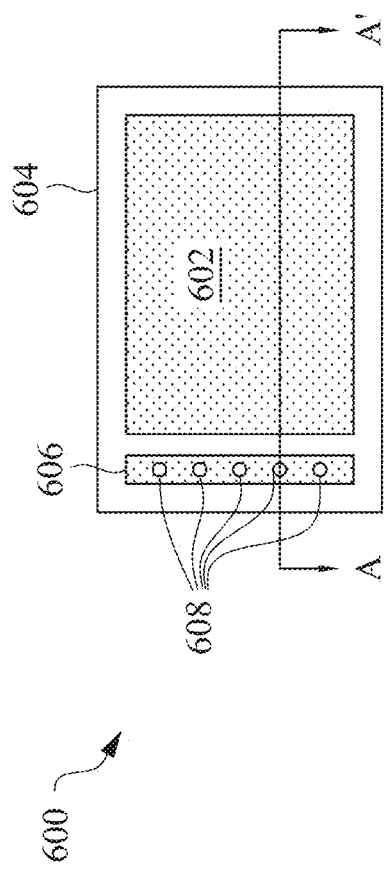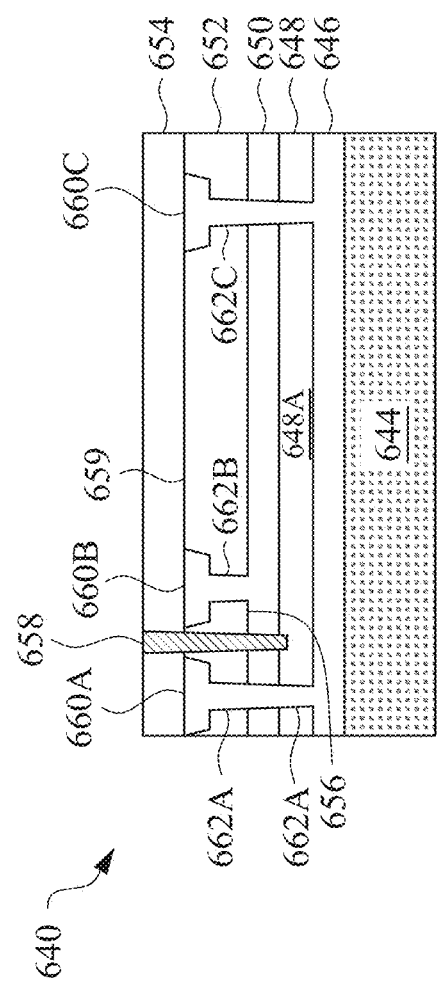

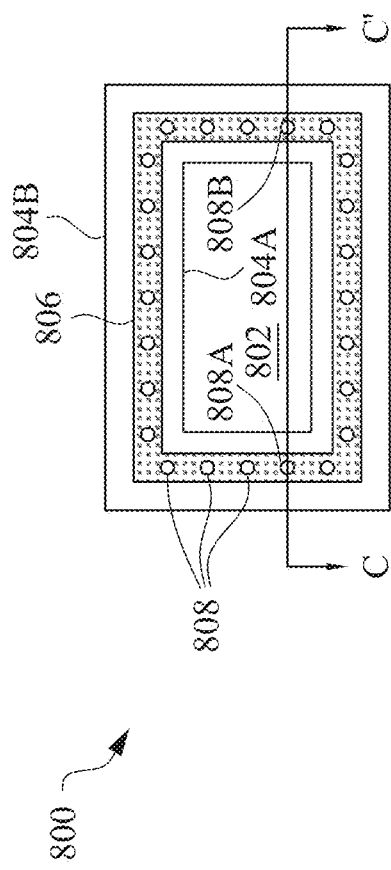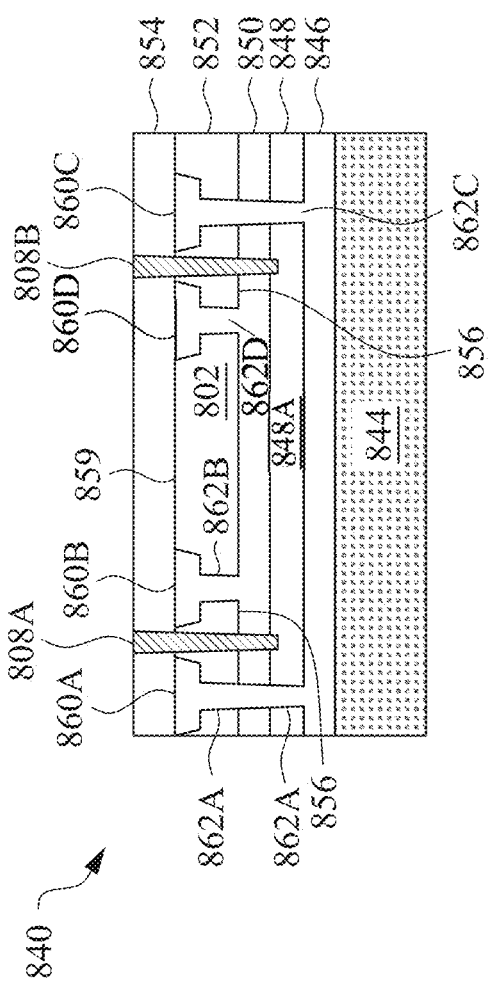

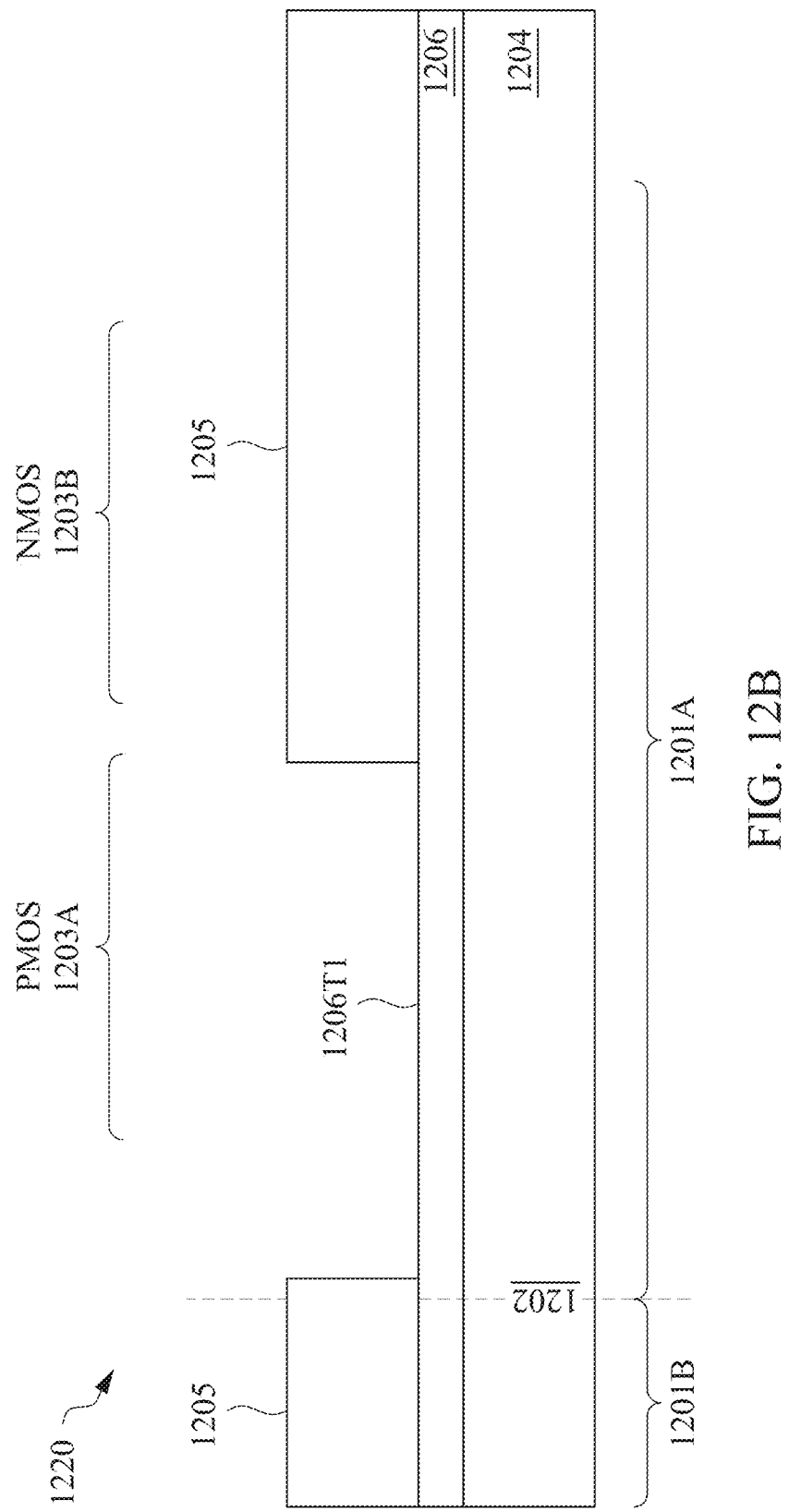

SEMICONDUCTOR DEVICE HAVING BURIED BIAS PADS

PRIORITY CLAIM

This application claims the priority of China application no. 202010644848.3, filed Jul. 7, 2020, which is incorporated herein by reference in its entirety.

BACKGROUND

Breakdown voltage of integrated circuits is related to the thickness of a buried oxide layer between the transistors of an integrated circuit and the substrate. Increasing the breakdown voltage for transistors of the integrated circuit increases the window of operating voltages of the integrated circuit, and extends the functional life of the integrated circuit.

BRIEF DESCRIPTION OF THE DRAWINGS

FIG. 6A is a top view of an integrated circuit, in accordance with some embodiments.

FIG. 6B is a cross-sectional view of an integrated circuit, in accordance with some embodiments.

FIG. 8A is a top view of an integrated circuit, in accordance with some embodiments.

FIG. 8B is a cross-sectional view of an integrated circuit, in accordance with some embodiments.

FIGS. 12A-12D are cross-sectional views of an integrated circuit during a manufacturing process, in accordance with some embodiments.

DETAILED DESCRIPTION

Figure 1A:
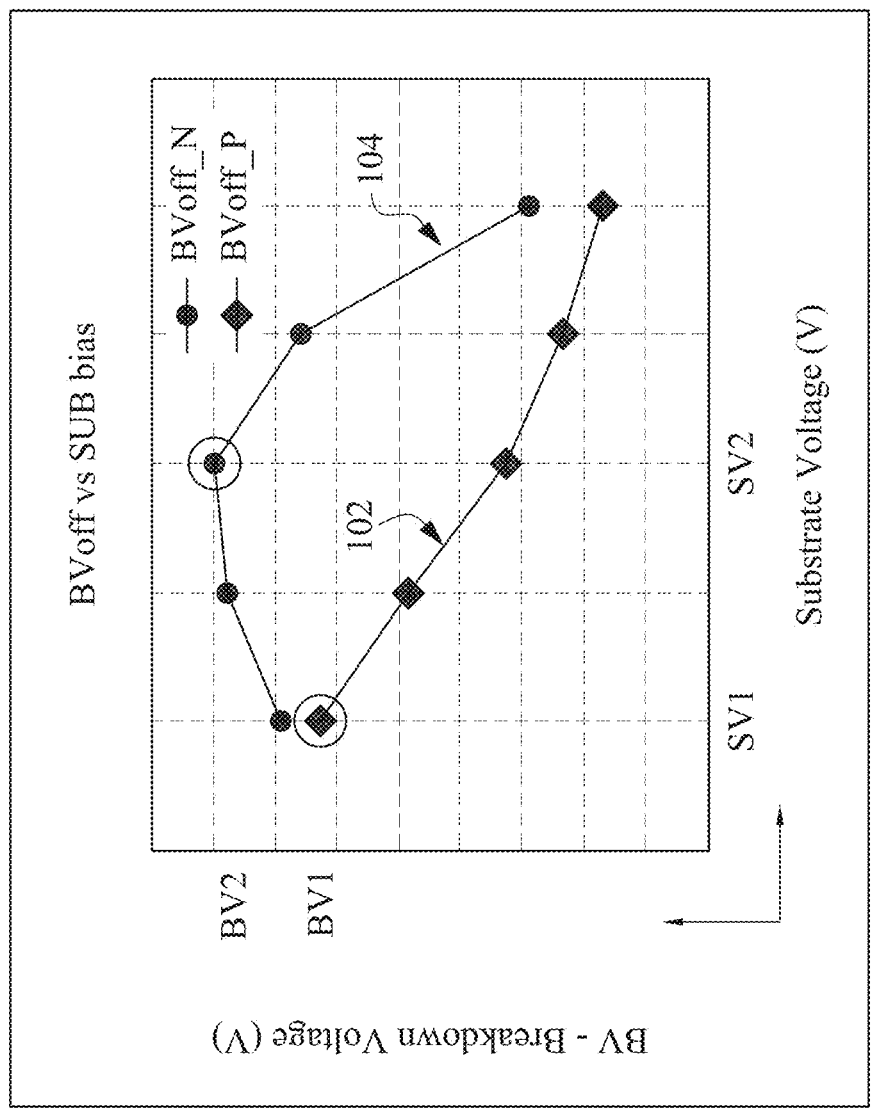
FIG. 1A is a chart of breakdown voltage of an integrated circuit as a function of substrate voltage, in accordance with some embodiments.

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transient or uncontrolled voltage in a substrate below a transistor influences a switching speed of the transistor and introduces noise into the signals generated by an integrated circuit. In some integrated circuits, switching speed of transistors is further influenced by a circuit structure which regulates a voltage to the substrate to prevent voltage transients, or uncontrolled changes in voltage, in the substrate below transistors. In some embodiments of the present disclosure, voltage is regulated using a bias pad which is embedded in a buried oxide layer between a transistor of the integrated circuit and the substrate of the integrated circuit. The bias pad is formed by dividing a layer of bias pad material (e.g., a layer of semiconductor material, a layer of metal, or an electrically conductive material) into regions which conform to the lateral dimensions of a transistor in an integrated circuit, a well of a transistor in an integrated circuit, or a cell area of an integrated circuit having multiple transistors or other circuit elements located therein. A bias pad is electrically connected to the integrated circuit interconnection structure. In some embodiments, the bias pad is electrically connected to a reference voltage ($V_{ss}$) of an integrated circuit. In some embodiments, the bias pad is electrically connected to a voltage having a value between the reference voltage and ground. A bias pad is connected to the interconnection structure of the integrated circuit by a bias contact. Bias contacts extend through the layer of semiconductor material having the doped wells for transistor source and drain regions, and through part of the buried oxide layer, down to the bias pad. Bias contacts transmit or apply a voltage to the bias pad, and thereby generate or apply a characterized electrical environment to the transistor above the bias pad. In some embodiments, the applied voltage is a fixed voltage. In some embodiments, the bias pad is electrically connected to a ground. In some embodiments, both the substrate and the bias pad receive applied voltages, as described herein, to apply a characterized electrical environment to the transistor above the bias pad. A description of bias contacts, bias pads, and methods of manufacturing bias contacts and bias pads follows below.

FIG. 1A is a chart 100 of breakdown voltage of an integrated circuit as a function of substrate voltage, in accordance with some embodiments. In chart 100, a breakdown voltage trend line 102 for P-type doped transistors is plotted against a breakdown voltage trend line 104 for N-type doped transistors. A voltage applied to the substrate is plotted along the horizontal axis of chart 100, lower values to the left and higher voltage values to the right of the horizontal axis. Breakdown voltage of the transistor and integrated circuit is plotted on the Y, or vertical, axis of chart 100, with lower breakdown voltages at the bottom of the vertical axis and higher breakdown voltages at the top of the axis. In chart 100, the highest point on a breakdown voltage trend line indicates that the breakdown voltage is greatest, for each of the two types of transistors (e.g., P-type, or PMOS, and N-type, or NMOS), at different substrate voltages. In order to increase the overall breakdown voltage performance of an integrated circuit across the integrated circuit, the present disclosure describes a structure which includes individual bias pads within the buried oxide layer for which a bias voltage (e.g., the applied voltage, similar to the substrate voltage in FIG. 1A) is adjusted on an individual transistor basis. In some embodiments, multiple bias pads are positioned in the buried oxide layer under different sides of a transistor to individually accommodate different bias voltage breakdown values for N-wells or P-wells in a transistor structure.

Figure 1B:
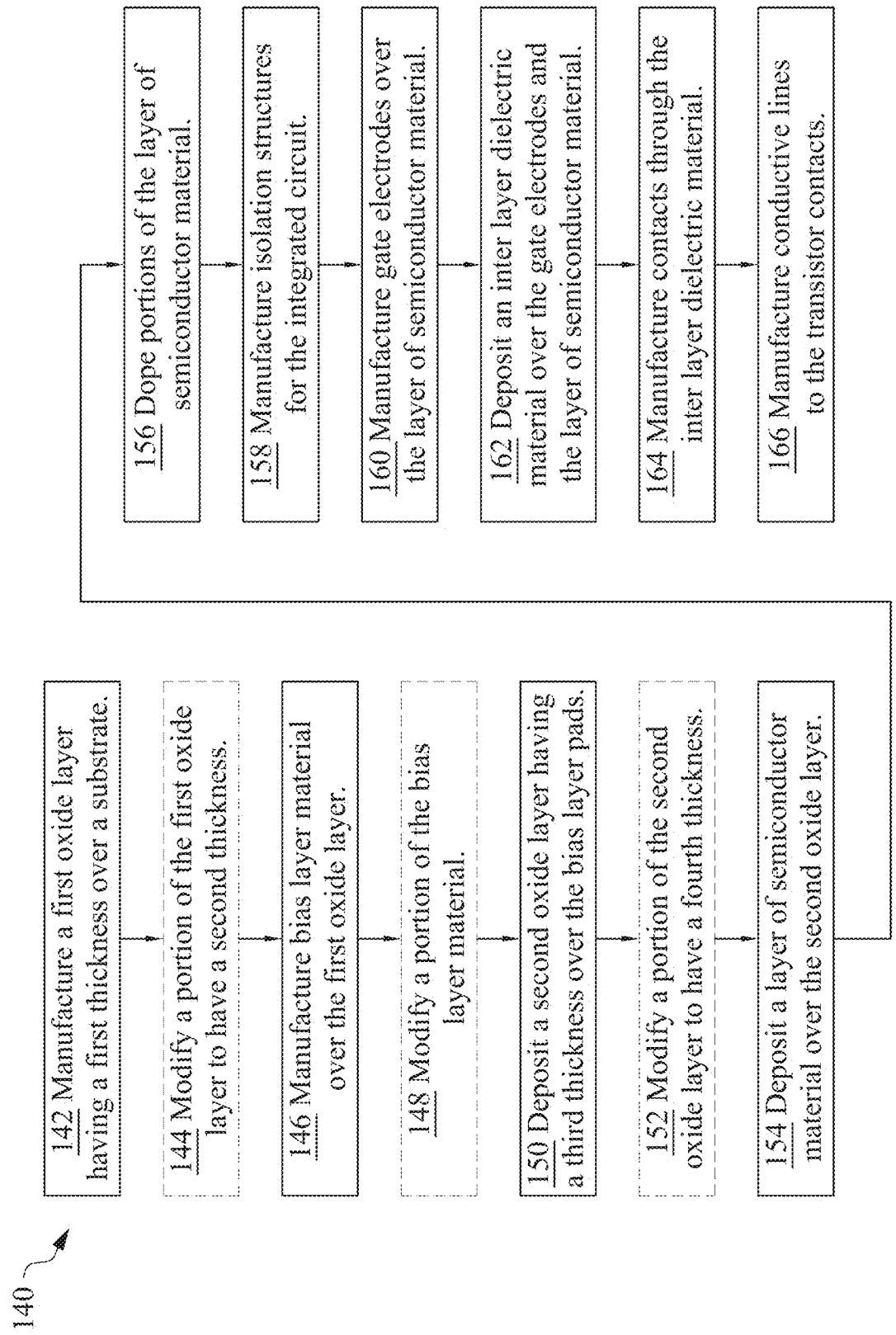
FIG. 1B is a flow diagram of a method of making an integrated circuit, in accordance with some embodiments.

FIG. 1B is a flow diagram of a method 140 of making an integrated circuit, in accordance with some embodiments. Method 140 includes an operation 142, in which a first oxide layer is deposited over a substrate for the integrated circuit. Performance of operation 142 corresponds to the deposition of first oxide layer 1106 in FIG. 11A, as described below. In some embodiments, the substrate is a semiconductor material (e.g., silicon, doped silicon, GaAs, or another semiconductor material). In some embodiments, the substrate is a P-doped substrate. In some embodiments, the substrate is an N-doped substrate. In some embodiments, the substrate is a rigid crystalline material other than a semiconductor material (e.g., diamond, sapphire, aluminum oxide ($Al_2O_3$), or the like) on which an integrated circuit is manufactured. In embodiments of substrates which experience leakage current between wells of transistors or other elements of an integrated circuit, an insulating layer (e.g., a buried oxide layer) is deposited over the semiconductor material to electrically isolate the substrate from the transistors of the integrated circuit. Reducing leakage current by manufacturing a buried oxide layer over a substrate decreases power consumption of the integrated circuit both during operation of the circuit, and during periods when the integrated circuit is idle. In some integrated circuits, the buried oxide layer is a single layer of insulating material over the top surface of the substrate. In some embodiments of the present disclosure, the buried oxide layer includes at least two layers of insulating material deposited in separate insulating material deposition steps. By depositing the buried oxide layer in two separate insulating material deposition steps, a layer of electrically conductive material (e.g., bias pad material) is deposited over a first oxide layer and under a second oxide layer (see below, operation 150). The first oxide layer electrically isolated the bias pad material (or, the bias pad after manufacturing, see operation 158, manufacture of isolation structures, below) from the substrate and other components of the integrated circuit.

According to some embodiments, the first oxide layer is a layer of silicon dioxide ($SiO_2$). In some embodiments, the first oxide layer is a layer of inorganic nitride over the substrate (e.g., silicon nitride ($Si_xN_y$), or the like). In some embodiments, the first oxide layer is deposited over a top surface of the substrate. In some embodiments, the first oxide layer is deposited by chemical vapor deposition (CVD) by, e.g., a combination of argon (Ar), silane ($SiH_4$), and oxygen ($O_2$) or water ($H_2O$), over the top surface of the substrate. CVD-deposited oxides are free from dopants unless deliberately included in the dopant reaction gas mixture used to form the CVD-deposited oxide. In some embodiments, the first oxide layer is grown from the top surface of the substrate by, e.g., rapid thermal processing (RTP). In some embodiments, RTP growth of a first oxide layer includes processing a substrate of semiconductor material in an ambient atmosphere which includes one or more of argon, oxygen, or water vapor at temperatures greater than 300 degrees Celsius (° C.). Oxide growth by RTP forms a dense and uniform oxide layer to electrically isolate the substrate from bias pads and the integrated circuit. RTP-grown oxide layers include dopants found in the upper region of the substrate near the top surface because the substrate material (semiconductor material, e.g., silicon, doped silicon, GaAs, or the like) is incorporated into the RTP-grown oxide. In some embodiments, a first oxide layer is formed on a top surface of the integrated circuit by depositing and curing a liquid material to form an oxide such as spin-on glass (SOG), BPSG (boron phosphorous spin-on glass), or FSG (fluorinated silica glass).

In some embodiments, the first oxide layer has a thickness ranging from about 50 Angstroms (Å) to about 50 nanometers (nm), although other thicknesses are also within the scope of the present disclosure. A first oxide layer having a thickness less than about 50 Angstroms does not provide sufficient electrical insulating capacity or coverage based on some methods of growing or depositing oxide on the layer of semiconductor material. Incomplete coverage for thin first oxide layers results in leakage current into the substrate. First oxide layers having film thicknesses of about 50 nm are achieved by depositing (via, e.g., a form of chemical vapor deposition, physical vapor deposition (PVD), or the like) an insulator material onto the substrate having good coverage and good insulating characteristics to reduce and/or eliminate leakage current from transistor wells into the substrate.

Method 140 includes an optional operation 144, in which a portion of the first oxide layer is modified to have a reduced thickness as compared to a thickness of the first oxide layer upon completion of operation 142. Performance of operation 142 corresponds to a thinning of the first oxide layer 1106 deposited in operation 140, as described above. In some embodiments, performance of operation 142 is performed on, e.g., first transistor 1103A and not on second transistor 1103B, or vice versa. Embodiments of method 140 wherein the electrical environment applied to the transistors is homogeneous across the integrated circuit, or across a semiconductor substrate (or, a semiconductor wafer) during a manufacturing process, omit optional operation 144 because the thickness of the first oxide layer, the bias pad, and the second oxide layer (see below) over the top of the bias pad, are similar across the integrated circuit or semiconductor substrate. Embodiments of method 140 wherein the electrical environment applied to the transistors is heterogeneous across the integrated circuit, or across the semiconductor substrate, include one or more film thickness modifying operations such as operation 144, operation 148, and/or operation 152, described below. According to some embodiments, the thickness of the first oxide layer after optional operation 144 is not less than 100 Angstroms to avoid breakdown of the first oxide layer when a voltage is applied to a bias pad and to a substrate below the bias pad. In some embodiments, the substrate and the bias pad are applied voltages with opposite signs (e.g., positive to the bias pad, and negative to the substrate) which causes breakdown of the first oxide layer when too thin.

In some embodiments, the first oxide is thinned below an entire transistor in a cell of the integrated circuit, while below another transistor in the same cell has no modification of the first oxide thickness. In some embodiments, the first oxide is thinned below one well of a transistor, while the first oxide below a different well of the transistor has no modification of the first oxide thickness. In some embodiments, the thinned portion of the first oxide layer and the unmodified portion of the first oxide layer intersect below the transistor, and are separated by formation of an isolation structure.

Figure 11A:
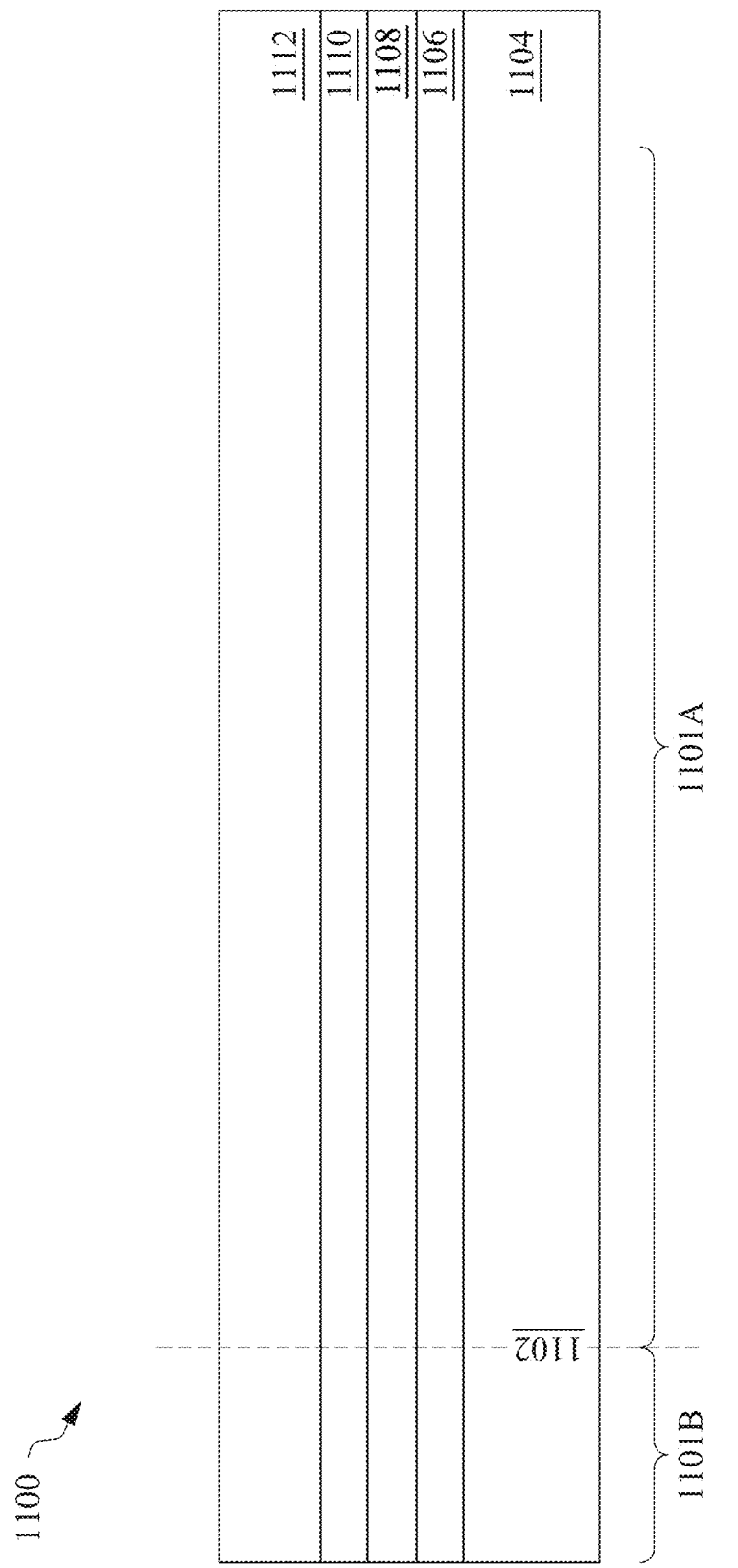
FIGS. 11A-11H are cross-sectional views of an integrated circuit during a manufacturing process, in accordance with some embodiments.

Method 140 includes an operation 146, in which a layer of bias pad material is deposited over the first oxide layer. Performance of operation 146 corresponds to the deposition of the layer of bias pad material 1108, as shown in FIG. 11A, below. As described above, the layer of bias pad material comprises an electrically conductive material. In some embodiments, the electrically conductive material is a metal film. In some embodiments, the metal film includes tungsten, cobalt, titanium, tantalum, nickel, alloys thereof, or the like. According to some embodiments, the metal film used for a layer of bias pad material is a same material forming bias contacts from a bias pad through the layer of semiconductor material and the upper portion of the buried oxide layer. According to some embodiments, the layer of bias pad material is a semiconductor material. In some embodiments, the semiconductor material is polysilicon. In some embodiments, the semiconductor material is a type semiconductor material such as gallium arsenide (GaAs), or the like.

In embodiments of method 140 where the layer of bias pad material is a metal film, the metal film is deposited by, e.g., sputtering the layer of material from a target over the top surface of the first oxide layer. Embodiments of method 140 where the layer of bias pad material is a semiconductor material, the semiconductor material is deposited by, e.g., atomic layer deposition (ALD), chemical vapor deposition (CVD), or the like. According to some embodiments, the bias pad material is a pure (undoped) semiconductor material. According to some embodiments, the bias pad material is doped during deposition. According to some embodiments, the bias pad material is a semiconductor material on which a metal silane layer is grown by depositing metal atoms on a layer of semiconductor material and annealing to interdiffuse the metal and silicon (or other semiconductor material) atoms. According to some embodiments, a metal silane layer is able to transmit the voltage applied to the bias pad across the bias pad, and therefore generate a desired electrical environment below a transistor more quickly than an undoped or a lightly doped semiconductor material for the bias pad.

According to some embodiments, the layer of bias pad material has a thickness ranging from about 10 nm to about 100 nm, although other thicknesses are also within the scope of the present disclosure. Bias pad material having a thickness less than about 10 nm are prone to incomplete coverage over the first oxide layer, resulting in an uneven electrical field below a layer of semiconductor material having transistor wells therein. Layers of bias pad material having thicknesses greater than about 100 nm do not provide increased benefit in terms of applied electrical field to the layer of semiconductor material. However, with increased thickness of the layer of bias pad material (e.g., at greater than 100 nm), the filling of isolation structures extending through the layer of bias pad material becomes more difficult and sometimes results in voids or gaps in the isolation structure material.

Figure 11B:
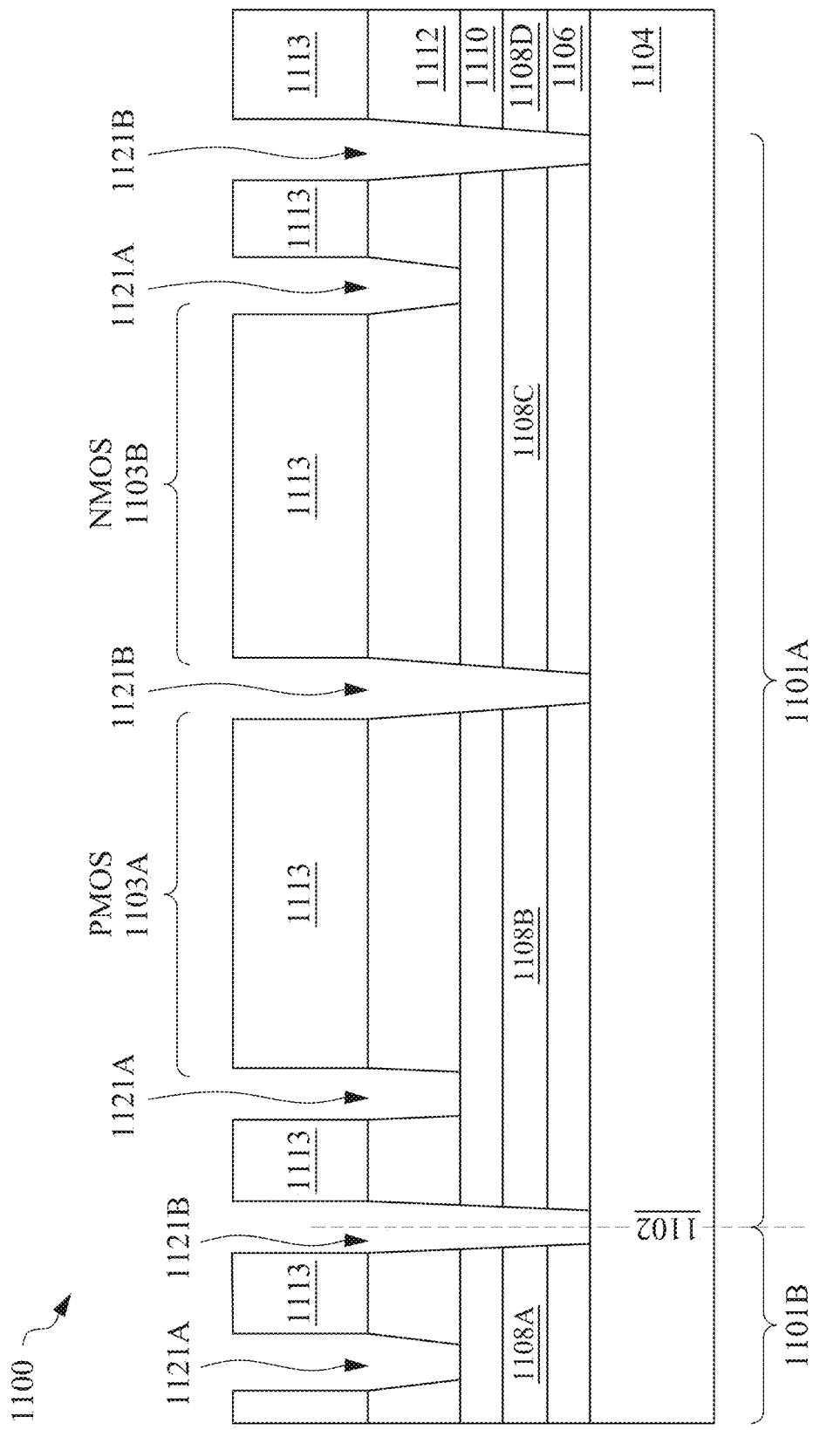

Method 140 includes an optional operation 148, in which a portion of the bias layer material is modified. Performance of optional operation 148 adjusts the thickness of layer of bias pad material 1108 as shown in FIG. 11A, below. In some embodiments, performance of optional operation 148 thins bias pad material for one transistor (e.g. first transistor 1103A, or second transistor 1103B, as shown in FIG. 11B). In some embodiments, performance of optional operation 148 thins bias pad material for multiple adjacent transistors (e.g., both first transistor 1103A and second transistor 1103B, as shown in FIG. 11B, below). In some embodiments, the modification is to reduce the thickness of a portion of the layer of bias pad material. In some embodiments, the modification is to form isolated bias pads from the layer of bias pad material before deposition of the second oxide layer (see below, operation 150). In some embodiments, the modification includes both reducing a thickness of a portion of the layer of bias pad material and forming isolated bias pads from the layer of bias pad material.

In some embodiments of the present disclosure, electrical properties below wells of the transistor are modified by changing a thickness of the bias pad layer, rather than decreasing the thickness of a portion of the buried oxide. According to some embodiments, a thickness of the layer of bias pad material is modified by applying a layer of patterning material over a top surface of the layer of bias pad material and transferring a pattern to the layer of patterning material. According to some embodiments, the layer of patterning material is a photoresist layer. According to some embodiments, the patterning material is able to be patterned using electron beams or extreme ultraviolet (EUV) lithography. In some embodiments, the pattern applied to the layer of patterning material includes pattern corresponding to openings in the layer of patterning material corresponding to locations where the layer of bias pad material is to be thinned.

Thinning the layer of bias pad material occurs by etching. In some embodiments, the layer of bias pad material is thinned by performing a dry or plasma etch process to anisotropically remove an exposed portion of the bias pad material while leaving a covered portion of the bias pad material unmodified. Dry etch or plasma etch processes configured to remove metal or metallic bias pad materials include halogenated reactants such as hydrochloric acid (HCl), hydrofluoric acid (HF), hydrogen bromide (HBr), chlorine ($Cl_2$), fluorine ($F_2$), or the like.

Dry etch or plasma etch processes which are anisotropic have a more vertical profile than isotropic etch processes, preserving the dimensions of the bias pad material below the layer of patterning material and avoiding undercut of the layer of patterning material. Undercuts lead to a greater number of voids in an integrated circuit during the manufacturing process. In some embodiments, undercuts become sufficiently pronounced to impact electrical connections between bias pads and bias contacts to the bias pad.

In some embodiments, thinning the layer of bias pad material is performed using wet etchants. According to some embodiments, wet etchants provide greater uniformity of removal during the thinning process. In some embodiments, undercut of the layer of patterning material during thinning of the layer of bias pad material is compensated for by modifying (shrinking) the dimensions of the opening in the layer of patterning material to make the opening smaller. In some embodiments, undercut of the layer of patterning material by isotropic etch during a wet etch thinning process is deliberately incorporated to achieve a desired dimension of the thinned bias pad, or the recess into the layer of bias pad material (e.g., prior to forming isolation structures through the layer of bias pad material).

In some embodiments, wet etchants are used for large openings in the layer of patterning material or for large thinned areas, because the wet etchant is less prone to leave residues of the thinning process on a top surface of the layer of patterning material. In embodiments where the layer of bias pad material is a metal or a metallic material, wet etching reduces a likelihood of metal residue contaminating the integrated circuit.

In some embodiments of the method, the modification is to form isolated bias pads from the layer of bias pad material before deposition of the second oxide layer (see below, operation 150). Separation of the layer of bias pad material into individual bias pads is performed in order to avoid damage to a circuit component (e.g., a transistor, such as in integrated circuit 1000 of FIG. 10, below) when the integrated circuit design places an isolation structure in proximity to a circuit element prone to damage, or which partially or completely masks or blocks the isolation feature between individual bias pads of an integrated circuit. In integrated circuit 1000, deep trench isolation structure (DTI) 1022A and DTI 1022C are separated from the transistor (or, from wells 1012A, 1012B, and 1012C), and extend through layer of semiconductor material 1012 and second oxide layer 1010 to first oxide layer 1006. However, DTI 1024 is directly below the gate electrode 1014G and only extends from second oxide layer 1010 to first oxide layer 1006. Because it is not possible to form DTI 1024 without disrupting the layer of semiconductor material 1012 in the transistor region, the layer of bias pad material is divided into individual pads before depositing the second oxide layer (see operation 150, below) or depositing the layer of semiconductor of material (see operation 154, below).

Method 140 includes an operation 150, in which a second oxide layer is deposited over the bias layer material. Performance of operation 150 corresponds to the deposition of second oxide layer 1110 as shown in FIG. 11A, below. The second oxide layer is deposited over the bias pad material by, e.g., a chemical vapor deposition (CVD) process such as low-pressure CVD (LPCVD), plasma-enhanced CVD (PECVD), or the like. The second oxide layer is not grown, as is sometimes the case with the first oxide layer, because the layer of bias pad material is not always a semiconductor material. The second oxide layer has a thickness ranging from about 10 nm to about 100 nm, although other thicknesses are also within the scope of the present disclosure. The second oxide layer is the layer of the buried oxide which is in direct contact with the layer of semiconductor material (see operation 154, below) which contains the wells of transistors for the integrated circuit. The second oxide layer is sufficiently thick that the potential between the bias plate and the wells of transistors shields the wells of transistors, and the channel regions of transistors, from transient or uncontrolled voltages in the substrate, while not suppressing carrier movement or inducing breakdown of the second oxide layer. Thicknesses of the second oxide layer smaller than about 10 nm are prone to breakdown, whereas thicknesses greater than about 100 nm are more likely to contribute to problems filling DTIs extending through the second oxide layer, and problems filling the openings for bias contacts and substrate contacts formed in operation 164, below.

Method 140 includes an optional operation 152, in which the thickness of the second oxide layer is modified, according to some embodiments. Performance of optional operation 152 corresponds to reducing the thickness of a second oxide layer (see second oxide layer 1110) as shown in FIG. 11A, below, prior to deposition of layer of semiconductor material 1112 in an operation 154, described below. In some embodiments, the second oxide layer has an uneven top surface because modifications to the thickness of the layer of bias pad material and/or the first oxide layer are transferred through the second oxide layer. In some embodiments, a chemical mechanical polishing (CMP) step is performed in optional operation 152 to flatten the top surface of a second oxide layer (and, incidentally thin, in some regions the second oxide layer over the "thick" portions of the first oxide layer or the layer of bias pad material). Optional operation 152 is performed when an uneven top surface of the second oxide layer further translates to an uneven top surface of the layer of semiconductor material having wells of the integrated circuit. An uneven surface of the layer of semiconductor material is more likely to result in uneven switching speeds, or unpredictable channel lengths because the top surface of the layer of semiconductor material is not uniformly flat, but textured according to underlying layers.

Method 140 includes an operation 154, in which a layer of semiconductor material is deposited over the second oxide layer. Performance of operation 154 corresponds to the deposition of a layer of semiconductor material such as layer of semiconductor material 1112 as described in FIG. 11A, et seq. below. In some embodiments, the layer of semiconductor material includes, e.g., pure silicon, doped silicon, silicon germanium (SiGe), or a type III-V semiconductor such as gallium arsenide (GaAs). In some embodiments, the layer of semiconductor material is deposited by atomic layer deposition or chemical vapor deposition (CVD) of the semiconductor material using, e.g., silane gas. In some embodiments, the layer of semiconductor is formed by depositing a silicon layer, followed by deposition of a dopant rich semiconductor material, and thermally processing the films to inter-diffuse the dopants and the silicon to form a dopant rich region at a top surface of the integrated circuit for the source, drain, and channel of a transistor.

Method 140 includes an operation 156, in which dopants are added to the layer of semiconductor material, in accordance with some embodiments. In some embodiments, dopants are added to the layer of semiconductor material to form N-wells, P-wells, and drift regions for channels of the transistors of the integrated circuit. In a non-limiting example, dopants are added to an N-well such as N-well 1112C in first transistor 1103A, or to N-well 1112D in second transistor 1103B. In a non-limiting example, dopants are added to a P-well such as P-well 1112A in first transistor 1103A or P-well 1112F in second transistor 1103B. In some embodiments, dopants are added to the layer of semiconductor material by, e.g., applying a layer of patterning material to mask portions of the layer of semiconductor material that are to remain undoped (e.g., regions outside the source, drain, or HVNW (high voltage N-wells) of the integrated circuit), transferring a pattern to the layer of patterning material to expose portions of the layer of semiconductor which are to receive dopants, and implanting the dopants from an ion source implant tool. In some embodiments, the steps of depositing the layer of patterning material, transferring a pattern to the layer of patterning material, and adding dopants by an ion source implant tool are performed separately for each doped region in the layer of semiconductor material. In some embodiments, some doped regions are added to the layer of semiconductor material with a same layer of patterning material, but with the substrate held at a different slant or tilt to direct implanted dopants to different areas of the exposed regions of the layer of semiconductor material. In some embodiments, the dopants are added to form N-wells for a source or drain of transistors. In some embodiments, the dopants are added to form P-wells of a drain or source of the transistors. In some embodiments, N-type dopants are added to form HVNW (high voltage N-wells) between transistor wells in the layer of semiconductor material. In some embodiments, the dopants are added at a low implant energy to form lightly doped regions (LDD regions) at a top surface of the transistor wells directly below contacts for the transistor source or the transistor drain. LDD regions at a top surface of a well for a transistor increase the carrier density, reducing the potential needed to switch the transistor to an "on" or active state, and decreasing the current ($I_{on}$) through the transistor during operation. In some embodiments, dopants are implanted into an LDD region such as LDD region 1115A in P-well 1112A as described in FIG. 11F.

Method 140 includes an operation 158, in which isolation structures for the integrated circuit are manufactured. Openings for isolation structures (see elements 1121A and 1121B of FIG. 11B) are etched through some of the films deposited over the substrate (see element 1102), as described below. Some openings 1121B are for long deep trench isolation structures (see elements 1122B, 1122D, and 1122F of FIG. 11C) and some openings 1121A are for deep trench isolation structures (see elements 1122A, 1122C, and 1122E of FIG. 11C). Deep trench isolation structures (DTI), mentioned above, are isolation structures which extend through the layer of semiconductor material, the second oxide layer, the layer of bias pad material, and into the first oxide layer. In some embodiments, DTI extend through the first oxide layer and into the substrate below the first oxide layer. In some embodiments, DTI correspond to locations of cell boundaries in the integrated circuit. In some embodiments, DTI correspond to isolation walls around an isolation region of the layer of semiconductor (a region where the bias contacts extend through the layer of semiconductor material, and which electrically isolate the transistor wells from the bias contacts, or from the semiconductor material in direct contact with the bias contacts extending through the isolation regions). In some embodiments, DTI electrically isolate bias pads in one cell, having a first voltage, from bias pads in a second (adjoining) cell, having a second voltage. In some embodiments, DTI electrically isolate a bias pad below one transistor in a cell, from a second bias pad below a second transistor in the same cell, such that each bias pad has a different voltage than another bias pad in the same cell. In some embodiments, DTI electrically isolate multiple bias pads below a single transistor, and are manufactured before deposition of the layer of semiconductor material.

Shallow trench isolation structures (STI) are formed at a top part of the layer of semiconductor material and extend part way, but not completely, through the layer of semiconductor material. STI are used in an integrated circuit to increase the separation between electrically conductive materials such as a source contact and a gate electrode over a channel of the transistor. STI are aligned with DTI in the cell of an integrated circuit.

An STI or a DTI is manufactured by depositing a layer of patterning material (photoresist, EUV resist, e-beam masking materials) over a top surface of the stack of films at a given stage of the integrated circuit manufacturing process, transferring a pattern to the layer of patterning material, and forming, within openings in the layer of patterning material, the isolation structures (STI or DTI). In some embodiments, an opening for the isolation structure is formed in the stack of films by etching the stack of films with a dry or plasma etch process. The chemistry of the etch plasma varies according to the material(s) being etched as the opening deepens. In some embodiments, insulating materials, such as silicon dioxide, for the buried oxide layer include fluorocarbons such as $CF_4$, trifluoromethane ($CHF_3$), difluoromethane ($CH_2F_2$), and gaseous HF. In some embodiments, oxygen is included in the etch plasma to remove polymer buildup during the etching process. A carrier gas such as argon is used adjust the total concentration of chemically-active etchant molecules during dissociation and etching to balance polymer formation on the integrated circuit surface and control the profile of the isolation structure openings. Isolation structure openings are formed with anisotropic etch processes (e.g., high directionality, associated with strong bombardment energies or large acceleration voltages) to maintain straight isolation structure sidewalls and reduce the likelihood of voids or pockets in the isolation structure filling materials.

In some embodiments, DTI are manufactured in the cell before STI are manufactured. In some embodiments, DTI and STI are manufactured after deposition of the layer of semiconductor material and the formation of transistor wells in the layer of semiconductor material. In some embodiments, a manufacturing process includes multiple iterations of manufacturing STI and DTI in order to generate bias pads for transistors and to accommodate variations in transistor designs having bias pads associated therewith.

Method 140 includes an operation 160, in which a gate electrode is manufactured over the layer of semiconductor material, in accordance with some embodiments. A non-limiting example of a gate electrode is depicted in FIG. 11E, where elements 1114G1 and 1114G2 overlay drift regions and wells of the first transistor and the second transistor of the integrated circuit 1100. In operation 160, as part of making a gate electrode such as gate electrodes 1114G1 and 1114G2 of FIG. 11E, a thin gate oxide layer is deposited over a top surface of the layer of semiconductor material to electrically isolate the channel region, below the gate oxide layer, and between the source well and the drain well, from the gate electrode. In some embodiments, the gate oxide is a layer of silicon dioxide (dielectric constant κ of about 3.7 to 3.9). In some embodiments, the gate oxide comprises hafnium dioxide ($HfO_2$, dielectric constant κ>12). In some embodiments, the gate oxide is a high-k dielectric (κ>3.9) other than hafnium dioxide (e.g., $ZrO_2$, and so forth).

In some embodiments, the gate electrode is manufactured by a dummy gate manufacturing process, wherein a blanket layer of a first inter layer dielectric (ILD) material is deposited over the gate oxide layer over the layer of semiconductor material, an opening is formed in the first ILD material to expose a portion of the gate oxide layer, and a plurality of liner materials, and a dummy gate material, are deposited into the opening. In some embodiments of dummy gate manufacturing processes, the dummy gate material is removed and filled with a gate electrode material before forming contacts to the source well (source region) and the drain well (drain region) of the transistor. In some embodiments of dummy gate manufacturing processes, the dummy gate material is removed and filled with gate electrode material after forming source and drain contacts through the first ILD material.

In some embodiments, a blanket layer of gate electrode material is deposited over the gate oxide layer, a layer of patterning material is deposited over the gate electrode material and patterned with remaining lines or remaining features corresponding to locations of gate electrodes over the channels of transistors in the integrated circuit. In some embodiments, the layer of gate electrode material is etched to remove unprotected gate electrode material and unprotected gate oxide material and to expose the layer of semiconductor material having transistor wells (source, drain, HVNW, and so forth) therein. In some embodiments, one or more spacer layers are deposited over the gate electrode stack (the remaining portion of gate electrode material and remaining portion of the gate oxide), and etched back to leave a remaining portion of the spacer layers at the sides of the remaining portion of gate electrode material and the remaining portion of the gate oxide.

In some embodiments, the gate electrode is part of a fin field effect transistor (FinFET) and the gate electrode extends continuously over a top and sides of a fin of dielectric material having therein the source well, the drain well, and the channel. In some embodiments, the fin field effect transistor includes multiple fins made from the layer of dielectric material, the fins being separated from each other by an insulating material such as the first ILD described hereinabove in reference to the dummy gate manufacturing process. In some embodiments, the gate electrode is a line of material separated from a flat or planar layer of semiconductor material by the remaining portion of the gate dielectric layer.

Method 140 includes an operation 162, in which an interlayer dielectric (ILD) film is deposited over the gate electrode and the wells of the integrated circuit. Deposition of an ILD film over a gate electrode and wells of the integrated circuit corresponds to deposition of the ILD film. In some embodiments, the ILD film includes at least one insulating material such a silicon dioxide, spin on glass, boron phosphorous silica glass, or some other dielectric or insulating material with a dielectric constant κ of about 4. In some embodiments, the ILD film is a low-κ dielectric material with a dielectric constant κ of less than about 2.5, such as SICOH®, Black Diamond®, SiLK®, and so forth. In some embodiments, ILD films are deposited by a variant of a CVD process, such as PECVD (plasma enhanced CVD), LPCVD (low pressure CVD), LACVD (laser assisted CVD), and the like. In some embodiments, an ILD film is formed by depositing a liquid material over the top of the wafer or substrate, spinning the wafer or substrate to produce a reduction in film thickness of the liquid material, and curing the liquid material to trigger, e.g., cross-linking of within the ILD film, or polymerization of the liquid material, or to produce a degassing effect as a solvent or liquid component evaporates while a solid material remains behind to form the ILD film.

Method 140 includes an operation 164, wherein contacts are manufactured through the ILD. A non-limiting example of manufacture of contacts through the ILD is described in FIG. 11G, where contacts 1118A-1118C are manufactured down to bias pads 1108A-1108C, drain contact 1116D1 is manufactured down to drain well 1112A, source contact 1116S1 is manufactured down to N-well 1112C, and gate contact 1116G1 is manufactured to gate electrode 1114G1. Transistors are formed in different groups in order to facilitate the profile control and selectivity of the etch process with respect to the material at the bottom, or on the sides, of the contact opening during the contact opening etch process. Etching contacts involves a step of depositing a layer of patterning material over a top surface of the ILD film deposited in operation 162. Etching contacts further involves a step of transferring a pattern to the layer of patterning material, with openings in the patterning material corresponding to positions of contact in the material(s) being etched. Etching contacts further involves at least one etch step, wherein the material exposed at the bottom of openings in the patterning material are removed by liquid or plasma-type etchants to expose underlying material for a predetermined amount of time, or until a particular material or film is exposed at the bottom of the etched opening.

In some embodiments, the contacts are transistor contacts, which make electrical connection to a source well, a drain well, or a gate electrode of a transistor in the semiconductor device. In some embodiments, the contacts are bias contacts, which extend from a top surface of the first ILD film down to a bias pad embedded within the buried oxide layer or sandwiched between the first oxide layer and the second oxide layer, and surrounded within the buried oxide layer by a deep trench isolation structure which loops around the bias pad. In some embodiments, the contacts are substrate contacts, which extend from a top surface of a first ILD film down to the substrate. In some embodiments, the substrate contacts intersect and electrically connect with a bias pad in the buried oxide layer. In some embodiments, the substrate contacts are separated from the bias pads and the bias contacts in the buried oxide layer.

Contacts are filled with a metal or metallic compound, such as tungsten, cobalt, nickel, titanium, tantalum, or the like, and alloys thereof. Contacts are filled by sputtering the metal or metallic compound, or by atomic layer deposition of metallic compounds over exposed sidewalls and the bottom of the contact opening, and allowing the metallic compound to grow and fill the contact opening. Subsequent to filling the contact opening, a chemical mechanical polishing step is performed to remove contact metals from a top surface of the first ILD film and isolate the top ends of the contacts from each other. In some embodiments, etch processes to form contact openings are performed sequentially to make, e.g., shallow contacts such as transistor contacts, separately from deeper contacts, such as bias contacts and substrate contacts.

Method 140 includes an operation 166, wherein the transistor contacts are connected to an interconnect structure of the integrated circuit, according to some embodiments. In some embodiments, the transistor contacts electrically connect to other contacts or vias in the interconnection structure. In some embodiments, the transistor contacts electrically connect to conductive lines in an ILD layer over the layer of dielectric material which contains the transistor contacts. In a non-limiting example described in FIG. 11H, conductive line 1124A electrically connects bias contact 1118B and drain contact 1116D1, and conductive line 1124B electrically connects source contact 1116S2 to bias contact 1118C, and conductive lines 1124A and 1124B are within ILD layer 1119.

According to some embodiments, the operations described hereinabove are performed in a different order than the order presented above. In some embodiments, the operations described hereinabove are performed with additional operations intermixed therein. In some embodiments, some of the operations described above are omitted from the method while still producing the structures described hereinbelow. Such variations in the method described above do not limit the scope of the present disclosure and should be understood by a person skilled in the art as natural variations which occur in, but do not detract from, the scope of the disclosure with respect to making variations on the structures disclosed herein.

Figure 2:
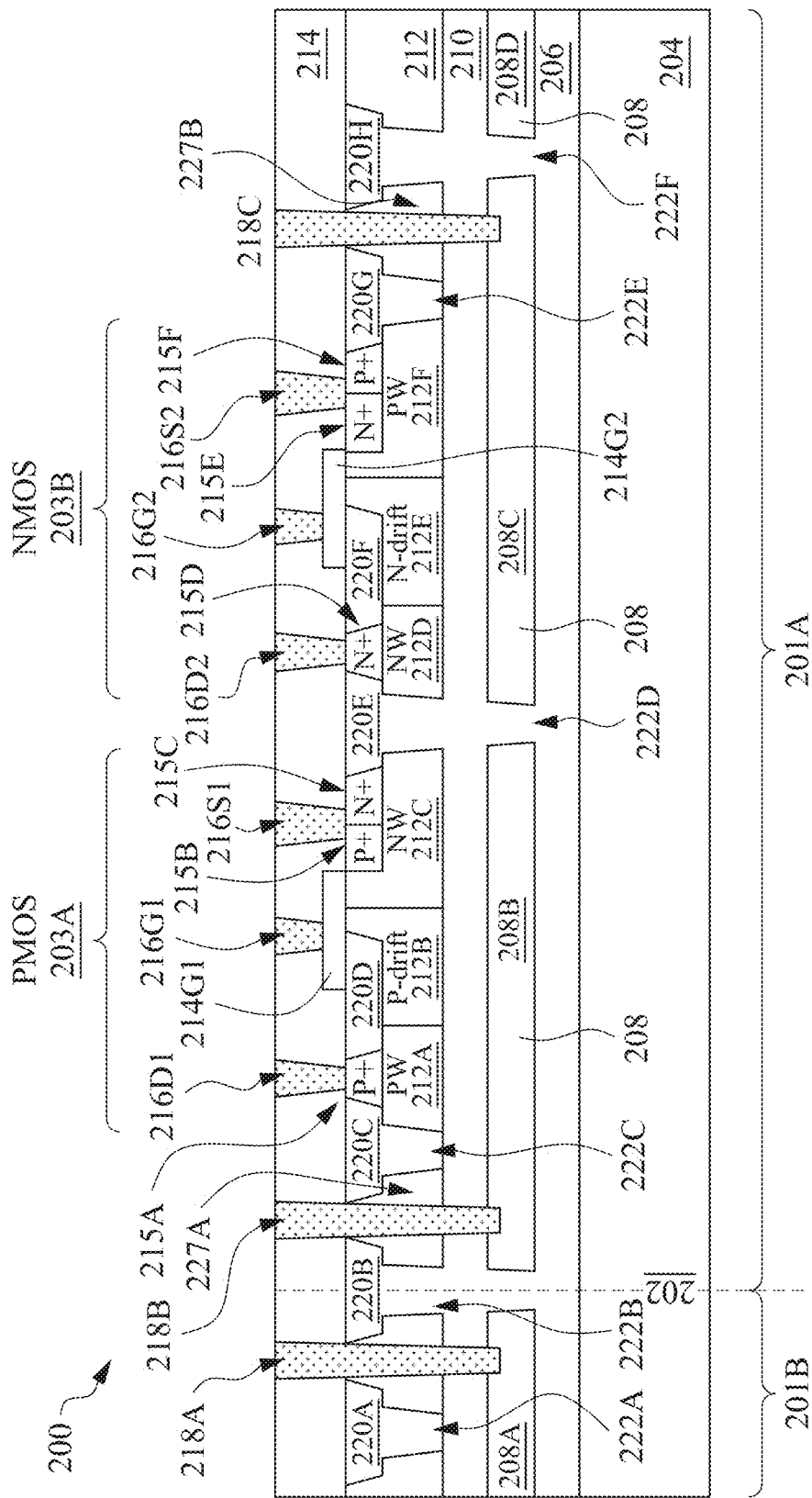
FIG. 2 is a cross-sectional view of an integrated circuit, in accordance with some embodiments.

FIG. 2 is a cross-sectional view of integrated circuit 200, in accordance with some embodiments. Integrated circuit 200 includes a substrate 204 wherein a first cell 201A of the integrated circuit adjoins a second cell 201B. A cell boundary 202 indicates a transition point between first cell 201A and second cell 201B. In some embodiments, first cell 201A is a high-voltage cell and second cell 201B is a low-voltage cell. A first oxide layer 206 has been deposited on a top surface of substrate 204. A layer of bias pad material 208 is over the first oxide layer 206. The layer of bias pad material 208 has been divided into individual bias pads 208A, 208B, 208C, and 208D. Bias pad 208A is in second cell 201B. Bias pads 208B, 208C, and 208D are in the first cell 201A. The individual bias pads are separated by deep trench isolation structures (DTI), described below.

A second oxide layer 210 is over the top surface of the individual bias pads 208A-208D. A layer of semiconductor material 212 is over the second oxide layer 210. The layer of semiconductor material 212 includes a plurality of wells for transistors of the integrated circuit 200. A first transistor 203A is a PMOS device, wherein the source well 212C is an N-doped well 212C, the drain well 212A is a P-doped well, and the channel region includes a P-drift region 212B. In first transistor 203A, the source well 212C includes two heavily doped regions 215B and 215C. The heavily doped region 215B has a net P-type doping profile and heavily doped region 215C has a concentration of N-type dopants greater than the concentration of N-type dopants in well 212C. Drain well 212A includes a P-type doped heavily doped region 215A. The inclusion of doped regions in the source well 212C and the drain well 212A reduces a contact resistance between the contact and the source/drain electrode. The inclusion of P-type doped heavily doped region 215B in source well 212C promotes high carrier concentration adjacent to the channel region directly below gate electrode 214G1.

A second transistor 203B is an NMOS device, having a P-doped source well 212F, and N-type doped drain well 212D and a channel region which includes an N-type doped drift region 212E between the source well 212F and the drain well 212D. Second transistor 203B includes heavily doped regions 215D in the drain well 212D, heavily doped region 215E in the P-doped source well 212F and heavily doped region 215F in the source well 212F. Doped region 215F has a higher concentration of P-type dopants then is found in P-doped well 212F. Doped region 215E has a net N-type dopant concentration. Heavily doped region 215E in source well 212F generates a high carrier concentration at the P/N junction where heavily doped region 215E meets heavily doped region 215F and P-doped source well 212E. The high carrier concentration in the source well 212F at the P/N junction enhances the ability of the second transistor 203B to switch on quickly.

Shallow trench isolation structures (STI) extend partway through the layer of semiconductor material 212. Deep trench isolation structures (DTI) extend entirely through the layer of semiconductor material 212. Some deep trench isolation structures further extend through the second oxide layer 210 and the layer of bias pad material 208 to create individual bias pads 208A-208D.

First interlayer dielectric (ILD) film 214 is over the top surface of the layer of semiconductor material 212. As described above in method 140, the first ILD film 214 electrically isolates transistors in first cell 201A from transistors in second cell 201B and, within each transistor, the source, the drain, and gate electrode, and the contacts electrically connected thereto from each other. In integrated circuit 200, two different types of contacts extend through first ILD film 214. Bias contacts 218A, 218B, and 218C, extend through first ILD film 214, the layer of semiconductor material 212, and the second oxide layer 210, to electrically connect with individual bias pads. Bias contact 208A electrically connects with bias pad 218A in second cell 201B. Bias contact 218B electrically connects with bias pad 208B in first cell 201A. Bias contact 218C electrically connects with bias pad 208C in first cell 201A. Bias contacts conduct an electrical potential from the interconnection structure of an integrated circuit 200 down to the bias pads below transistors in order to modify the electrical environment around the source wells and channel regions of transistors in an integrated circuit. In integrated circuit 200, bias pad 208A, bias pad 208B, and bias pad 208C are configured to modify the electrical environments below single transistors. In some embodiments, each bias contact conducts a different electrical potential to the bias pad to which the bias contact is connected. In some embodiments, the individual bias contacts conduct the same electrical potential to the bias pads to which they are connected.

Bias contact 218A extends through first ILD film 214, layer of semiconductor material 212, and second oxide layer 210, and down to bias pad 208A. In some embodiments, bias contact is against a top surface of bias pad 208A. In some embodiments, bias contact 218A extends down into bias pad 208A. Bias contact 218A is laterally separated from STI 220A and STI 220B.

In a similar fashion, bias contact 218B and bias contact 218C extend through first ILD film 214, layer of semiconductor material 212, and second oxide layer 210 down to bias pads. Bias contact 218B is laterally separated from STI 220B and STI 220C. Bias contact 218C is laterally separated from STI 220G and STI 220H.

Integrated circuit 200 includes transistor contacts which extend through first ILD film 214 down to the source, drain, and electrode of each transistor. For example, in the first transistor 203A, source contact 216S1 extends through first ILD film 214 down to a top surface of N-well 212C, making connections with LDD regions 215B and 215C at a top end of N-well 212C. Drain contact 216D1 extends through ILD film 214 down to LDD region 215A at a top end of drain well 212A. Gate contact 216G1 extends through first ILD film down to a top surface of gate electrode 214 G1. Gate electrode 214G1 is against a top surface of N-well 212C, a top surface of drift region 212B, and a top surface of STI 220D. STI 220D separates gate electrode 214G1 from P-doped drain well 212A and from P-doped LDD region 215A at a top end of drain well 212A.

Transistor contacts in second transistor 203B are as follows. Drain contact 216D2 extends through first ILD film 214 down to LDD region 215D at a top end of N-well 212D. Source contact 216S2 extends through first ILD film 214 down to LDD regions 215E and 215F at the top end of source well 212F. Gate contact 216G2 extends through first ILD film down to a top surface of gate electrode 214G2. Gate electrode 214G2 extends across a top surface of STI 220F, N-doped drift region 212 and source well 212F. According to some embodiments, the gate electrode extends over a top surface of the LDD region in the source well.

Figure 3:
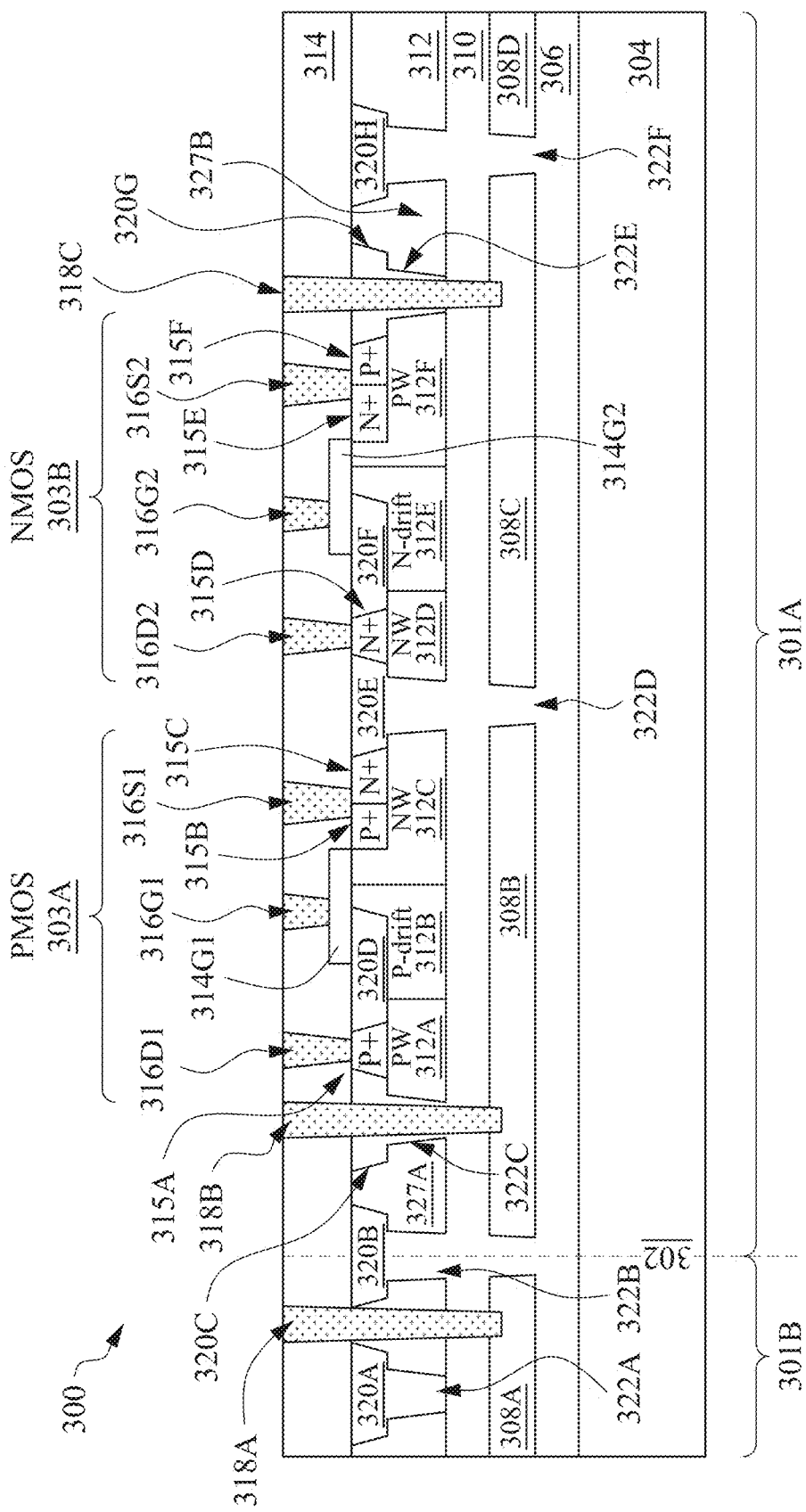
FIG. 3 is a cross-sectional view of an integrated circuit, in accordance with some embodiments.

FIG. 3 is a cross-sectional view of an integrated circuit 300, in accordance with some embodiments. The elements of integrated circuit 300 which match structure and function of the elements described above for integrated circuit 200 are given a same identifying reference numeral incremented by 100. Differences between integrated circuit 300 and integrated circuit 200 are described herein below.

In integrated circuit 300, second cell 301B includes bias contact 318A which extends through first ILD film 314, layer of semiconductor material 312, and second oxide layer 310 down to bias pad 308A. Bias contact 318A is laterally separated from STI 320A and STI 320B. In first cell 301A, bias contacts 318B and 318C are at different positions from bias contacts 218B and 218C in integrated circuit 200. Bias contact 318B extends through first ILD film 314, STI 320C, DTI 322C, and second oxide layer 310 before reaching bias pad 308B. Similarly, bias contact 318C extends through first ILD film 314, layer of semiconductor material 312, second oxide layer 310, before reaching bias pad 308C. Bias contacts 318B and bias contact 318C represent bias contacts electrically isolated from semiconductor material of the layer of semiconductor material 312. According to some embodiments of the present disclosure, the bias contacts extending through the layer of semiconductor material are isolated from the transistors within isolation regions of the layer of semiconductor material. See, e.g., isolation regions 227A and 227B in integrated circuit 200. In some embodiments, such as integrated circuit 300, bias contacts are electrically isolated from transistors of an integrated circuit by positioning the bias contacts such that they extend through isolation structures and are laterally separated from semiconductor material by the surrounding insulating material of deep trench isolation structures. According to some embodiments, a manufacturer selects to position bias contacts within deep trench isolation structures in order to save space within the integrated circuit by eliminating isolation regions (see, isolation region 227B in integrated circuit 200) to reduce the die area of an integrated circuit. According to some embodiments, each bias contact in a cell of an integrated circuit is positioned within and extending through deep trench isolation structures. According to some embodiments, some bias contacts in a cell extend through deep trench isolation structures, and some bias contacts extend through isolation regions in a layer of semiconductor material. The positioning of bias contacts within a cell of an integrated circuit is related to the amount of space available for positioning the bias contacts and the process window for manufacturing the bias contact, namely thickness of the layer of semiconductor material and selectivity of the etch process to the dielectric materials of the first ILD film, the semiconductor material exposed below the first ILD film, and the second oxide layer over the bias pad.

Figure 4:
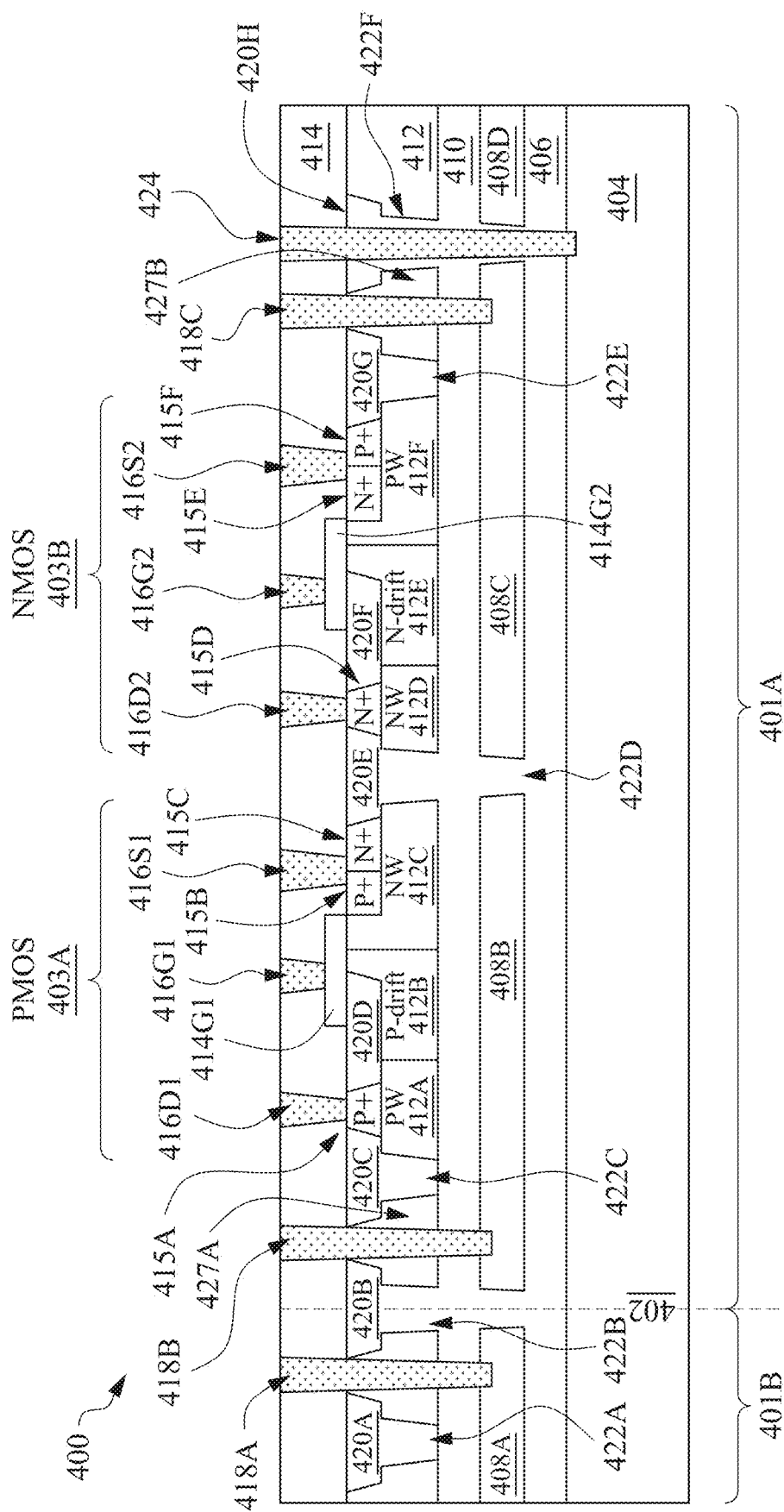
FIG. 4 is a cross-sectional view of an integrated circuit, in accordance with some embodiments.

FIG. 4 is a cross-sectional view of an integrated circuit 400, in accordance with some embodiments of the present disclosure. In integrated circuit 400, elements which have a similar function and structure as the elements described above with regard to integrated circuit 200 are given a same identifying reference numeral incremented by 200, differences between integrated circuit 200 described above and integrated circuit 400 are discussed below. In integrated circuit 200, the substrate 204 is electrically isolated from the interconnection structure of the integrated circuit. In integrated circuit 400, the substrate is electrically connected to the interconnection structure of the integrated circuit by a substrate contract 424. Substrate contact 424 extends from a top surface of first ILD film down to the substrate 404. In some embodiments, substrate contact 424 is against a top surface of substrate 404. In some embodiments, substrate contact 424 extends down into substrate 404. Substrate contact 424 is separated from the semiconductor material in layer of semiconductor material 412 by dielectric material of DTI 422F and STI 420H. DTI 422F and STI 420H act as an insulating sleeve for substrate contact 424. Because substrate contact 424 is electrically isolated from bias contact 418C, substrate 404 and bias pads 408B and 408C are configured for application of three independent voltages.

Figure 5:
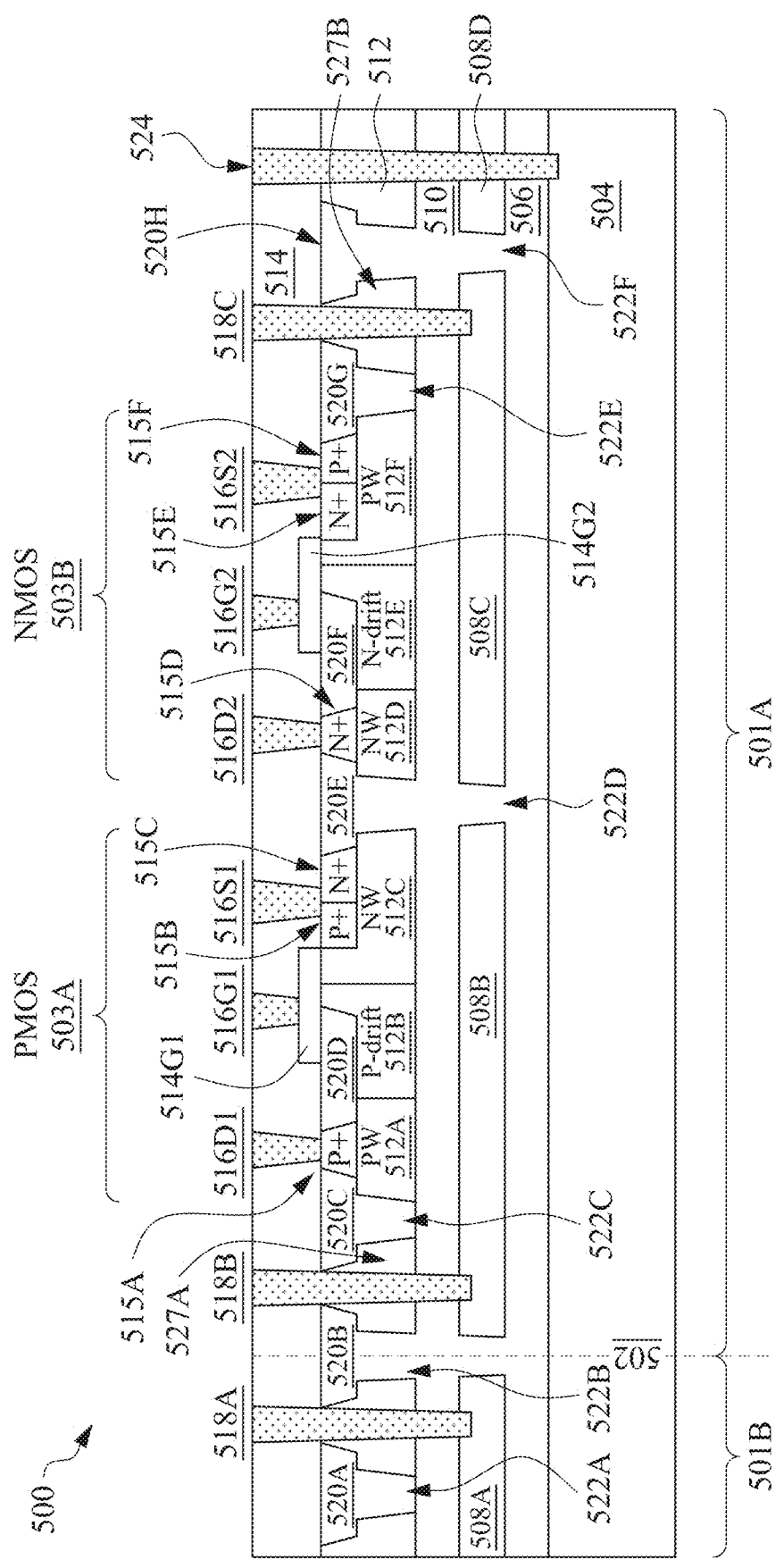
FIG. 5 is a cross-sectional view of an integrated circuit, in accordance with some embodiments.

FIG. 5 is a cross-sectional view of an integrated circuit 500, according to some embodiments of the present disclosure. In integrated circuit 500, elements of the integrated circuit which correspond to elements of integrated circuit 400 having a similar structure and/or function are given a same identifying reference numeral incremented by 100. Differences between integrated circuit 500 and integrated circuit 400 are described below. In integrated circuit 500, bias contact 524 extends from a top surface of first ILD film 514 down to substrate 504. Unlike substrate contact 424 in integrated circuit 400, which is electrically isolated from layer of semiconductor material 412, substrate contact 524 extends from a top surface of first ILD film 514 downward through layer of semiconductor material 512, second oxide layer 510, bias pad 508D, and first oxide layer 506, before reaching substrate 504. Bias contact 524 is electrically isolated from bias contact 518C, and electrically isolated from the transistors (first transistor 503A and second transistor 503B) by DTI 522F which is laterally separated from both substrate contact 524 and bias contact 518C. In some embodiments, the substrate contacts are separated from bias pads, but also extend through the layer of semiconductor material. In some embodiments, the substrate contacts extend through the layer of semiconductor material, and the bias contacts extend through DTI structures acting as an insulating sleeve. In some embodiments, all of the bias contacts and the substrate contacts extend through isolation structures and are separated from the layer of semiconductor material.

FIG. 6A is a top view of an integrated circuit 600, in accordance with some embodiments. In some embodiments, FIG. 6A corresponds to a single transistor of a cell of an integrated circuit (see, e.g., first transistor 203A in FIG. 2, or second transistor 203B in FIG. 2). In integrated circuit 600, a cross-sectional line A-A' extends through isolation structures 604, cell area 602, isolation region 606, and a bias contact 608. Isolation region 606 includes a plurality of bias contacts. Bias contacts 608 are pillar-type, or column-type bias contacts, having a columnar or cylindrical structure. Cell area 602 is the portion of the layer of semiconductor material which includes source wells, drain wells, and channels for transistors of integrated circuit 600. Isolation region 606 is a portion of the layer of semiconductor material which is isolated from the cell area 602 by isolation structure 604.

FIG. 6B is a cross-sectional view of an integrated circuit 640 with a structure corresponding to the structure of integrated circuit 600, described above. Integrated circuit 640 includes a substrate 644, a first oxide layer 646, a layer of bias pad material 648, a second oxide layer 650, layer of semiconductor material 652, and a first ILD film 654. Bias contact 658 extends downward through first ILD film 654, through isolation region 656 (corresponding to isolation region 606 in integrated circuit 600), second oxide layer 650, before reaching bias pad 648A. Bias pad 648A extends below an entirety of the transistor wells 659 within DTI 662B (at one side of the transistor wells 659) and DTI 662C (at an opposite side of transistor wells 659). Bias contact 658 is comparable to a contact such as bias contact 218B in FIG. 2, described above. In some embodiments, DTI 662A, 662B, and 662C form rings around a perimeter of, e.g., isolation region 606 and cell area 602 (comparable to transistor wells 659), and follow an outline similar to the shape of isolation structure 604, as described above in connection with FIG. 6A. Comparing integrated circuit 600 to integrated circuit 640, isolation structure 604 in integrated circuit corresponds to shallow trench isolation structures and deep trench isolation structures within the layer of semiconductor material 652, as follows: STI 660A and DTI 662A correspond to isolation structure 604 at a far side of isolation region 606 from cell area 602, STI 660B and DTI 662B corresponds to isolation region 604 between isolation region 606 and cell area 602, and STI 660 C and DTI 662C corresponds to isolation structure 604 at a far side of cell area 602 from isolation region 606 in integrated circuit 600.

Figure 7A:
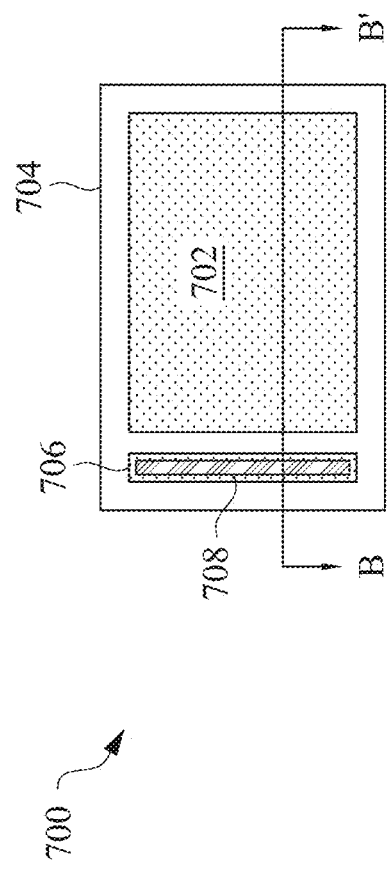
FIG. 7A is a top view of an integrated circuit, in accordance with some embodiments.

FIG. 7A is a top view of an integrated circuit 700, in accordance with some embodiments. Elements of integrated circuit 700 which have a similar function to elements of integrated circuit 600 have a same identifying reference numeral incremented by 100. Cross-sectional line B-B' extends through integrated circuit 700 at a position similar to the position of cross-sectional line A-A' in integrated circuit 600. The differences between integrated circuit 700 integrated circuit 600 are described below. In integrated circuit 700, bias contact 708 is a bar-type bias contact. Unlike the column-type bias contact 608 in integrated circuit 600, bias contact 708 has a deep trench structure which is filled with electrically conductive material to convey an applied electrical voltage to the bias pad transistor in the cell area of the integrated circuit. In some embodiments, inclusion of a bar-type bias contact rather than a column type bias contact depends on a process window for manufacturing the bias contact. In embodiments of integrated circuits where loading issues associated with etch processes for deep openings for bias contacts are low priorities, bar-type contacts are included because of the greater amount of contact between the bias pad and the interconnection structure of the integrated circuit. A bar type contact has a greater amount of flexibility when positioning electrical connections from the interconnection structure down to the bias contact. Column-type bias contacts general require greater precision in terms of positioning electrical connections to the column-type bias contacts, and have more stringent process windows in order to ensure that the dimensions of the electrical connection to the column-type bias contact do not increase electrical resistance between the interconnection structure and the bias pad below the cell area of the integrated circuit.

Figure 7B:
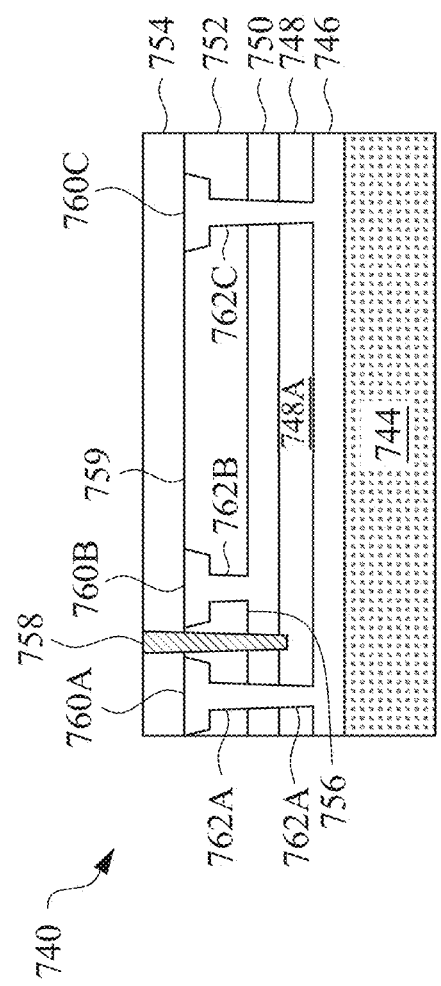
FIG. 7B is a cross-sectional view of an integrated circuit, in accordance with some embodiments.

FIG. 7B is a cross-sectional view of an integrated circuit 740 with a structure corresponding to the structure of integrated circuit 700, described above. Integrated circuit 740 includes a substrate 744, a first oxide layer 746, a layer of bias pad material 748, a second oxide layer 750, layer of semiconductor material 752, transistor wells 759, and a first ILD film 754. Bias contact 758 extends downward through first ILD film 754, through isolation region 756 (corresponding to isolation region 606 in integrated circuit 600), second oxide layer 750, before reaching bias pad 748A. Comparing integrated circuit 700 to integrated circuit 740, isolation structure 704 in integrated circuit corresponds to shallow trench isolation structures and deep trench isolation structures within the layer of semiconductor material 752, as follows: STI 760A and DTI 762A correspond to isolation structure 704 at a far side of isolation region 706 from cell area 702, STI 760B and DTI 762B corresponds to isolation structure 704 between isolation region 706 and cell area 702, and STI 760 C and DTI 762C corresponds to isolation structure 704 at a far side of cell area 702 from isolation region 706 in integrated circuit 700.

FIG. 8A is a top view of an integrated circuit 800, in accordance with some embodiments. Cross-sectional line C-C' extends through integrated circuit 800 at a same position with which cross-sectional line A-A' extends through integrated circuit 600. Cross-sectional line C-C' extends through isolation structure 804A and isolation structure 804B, isolation region 806, cell area 802, and to bias contacts 808. In integrated circuit 800, bias contacts 808 are pillar-type bias contacts similar to the bias contacts 608 in integrated circuit 600. Cell area 802 is completely surrounded by isolation region 806. Isolation structure 804A is completely surrounded by isolation region 806 within the layer of semiconductor material, between cell area 802 and isolation region 806. Cell area 802 includes a portion of a layer of semiconductor material in which source wells, drain wells, and channel regions of transistors are manufactured. Isolation region 806 includes a portion of a layer of semiconductor material outside of the cell area through which bias contacts and/or substrate contacts extend in order to make electrical connections between an interconnection structure of an integrated circuit and bias pads or the substrate below cell area 802.

FIG. 8B is a cross-sectional view of integrated circuit 840, in accordance with some embodiments. Elements of integrated circuit 840 which have a same structure or function as elements of integrated circuit 640 have a same identifying reference numeral incremented by 200.

In integrated circuit 840, a substrate 844 has a first oxide layer 846 deposited thereon. A layer of bias pad material 848 is over the first oxide layer 846, below the transistor wells 859, and beneath a second oxide layer 850. A layer of semiconductor material 852 is between second oxide layer 850 and first ILD film 854. Bias contacts 808A and 808B extend through layer of semiconductor material 852 within isolation region 56. Isolation region 856 is separated from cell area 802 by STI 860B and DTI 862B on a side of cell area closest to bias contact 808A, and by DTI 860D and STI 862D on a side of cell area 802 closest to bias contact 808B. Isolation region 856 is separated from a remainder of layer of semiconductor material 852 by STI 860A and DTI 862A next to bias contact 808A, and by STI 860C and DTI 862C next to bias contact 808B. Thus, cell area 802 is surrounded on all sides by dielectric material (second oxide layer 850 on the bottom, STI and DTI structures within the layer of semiconductor material 852, and first ILD film 854 on a topside) having transistor contacts extending therethrough. In integrated circuit 840, DTI 862A extends through layer of semiconductor material 852, second oxide layer 850, and layer of bias pad material 848, down to first oxide layer 846. DTI 862C extends through the film stack of integrated circuit 840 in a manner similar to DTI 862A. DTI 862A and DTI 862C include a buried portion of isolation structure 804B in integrated circuit 800, and isolate bias pad 848A from the remainder of the layer of bias pad material 848.

Figure 9:
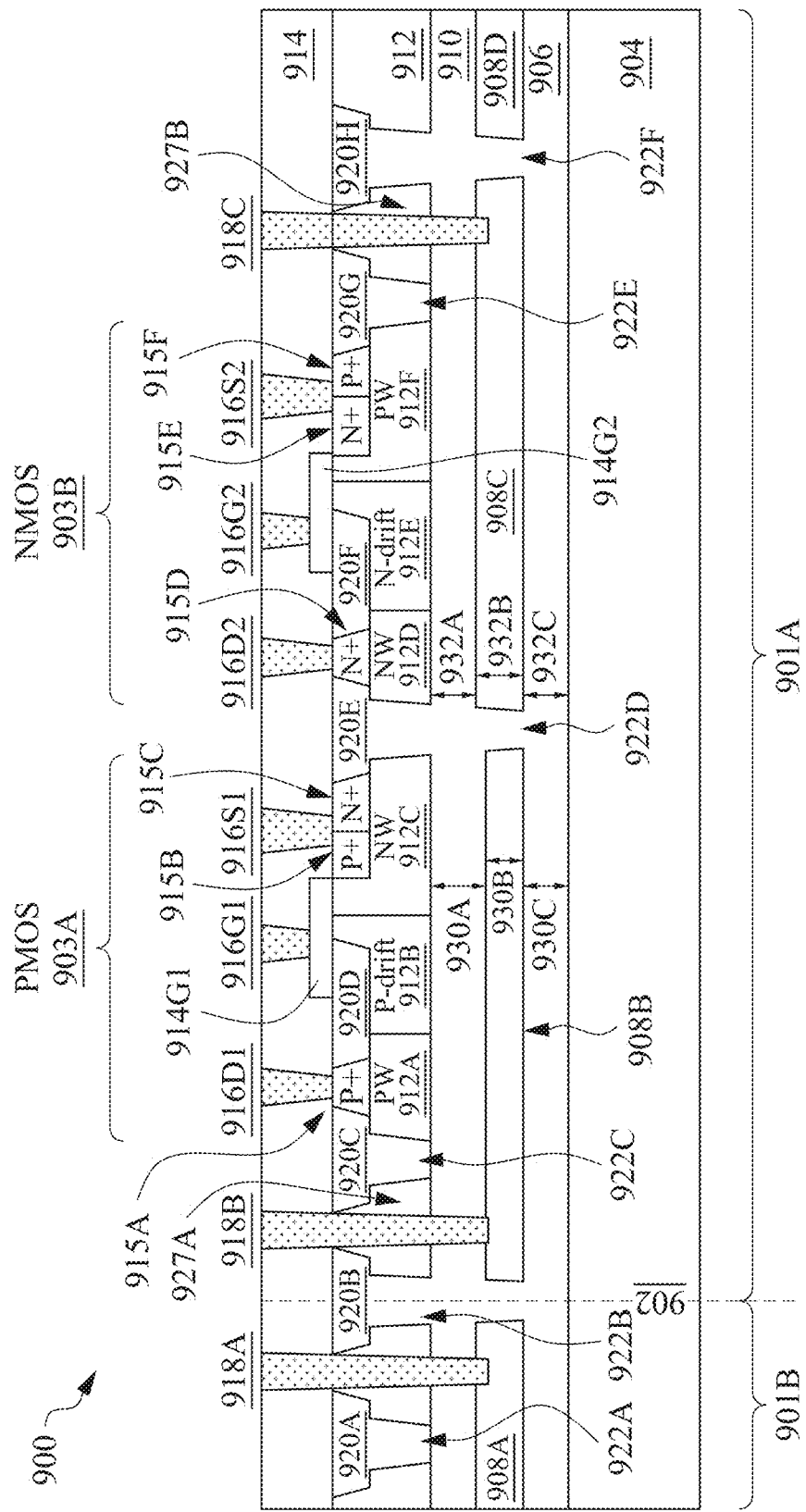
FIG. 9 is a cross-sectional view of an integrated circuit, in accordance with some embodiments.

FIG. 9 is cross-sectional view of an integrated circuit 900, in accordance with some embodiments. Elements of integrated circuit 900 which have a similar structure or function as elements of integrated circuit 200 have a same identifying reference numeral incremented by 700. Differences between the elements of integrated circuit 900 and integrated circuit 200 are described below.

In integrated circuit 900, first transistor 903A and second transistor 903B have different shaped bias pads. For first transistor 903A, second oxide layer 910 has a first thickness 930A, bias pad 908B has a bias pad thickness 930B, and oxide layer 906 has a first oxide layer thickness 930C. For second transistor 903B, second oxide layer 910 has a second oxide layer thickness 932A smaller than second oxide layer thickness 930A below first transistor 903A. For second transistor 903B, bias pad 908C has a bias pad thickness 932B which is larger than bias pad thickness 930B. Below second transistor 903B, first oxide layer 906 has a first oxide layer thickness 932C. In integrated circuit 900, first oxide layer thickness 930C is the same as first oxide layer thickness 932C. Varying the thickness of the bias pad, or the thickness of the second oxide layer, below a transistor provides a manufacturer an opportunity to modify the strength of the electric field experienced by the wells of the transistor as applied by the voltage transmitted to the bias pad by a biased contact. In some embodiments, the second oxide layer has a same thickness (e.g., the thickness of the second oxide layer 930A and the thickness of the second oxide layer 932A are the same), and the first oxide layer has different thicknesses between different transistors. According to some embodiments, steps associated with reducing the thickness of the film stack below a transistor are performed after deposition of the bias pad material and before deposition of the second oxide layer (such steps being, among others, deposition of a layer of patterning material, transferring a pattern to the patterning material where openings in the pattern correspond to locations where the bias pad material is to be thinned, and etching away exposed portions of the bias pad material using liquid etchants or plasma etching). In order to provide a smooth and flat surface prior to deposition of the layer of semiconductor material the second oxide layer is deposited according to some versions of method 140, such that a chemical mechanical polishing step is performed in order to reduce the thickness of the second oxide layer to a value corresponding the smallest second oxide thickness (see, e.g., the thickness of the second oxide layer 932A in FIG. 9) within a cell or across a semiconductor wafer, without having bumps or an uneven top surface of the second oxide layer.

Figure 10:
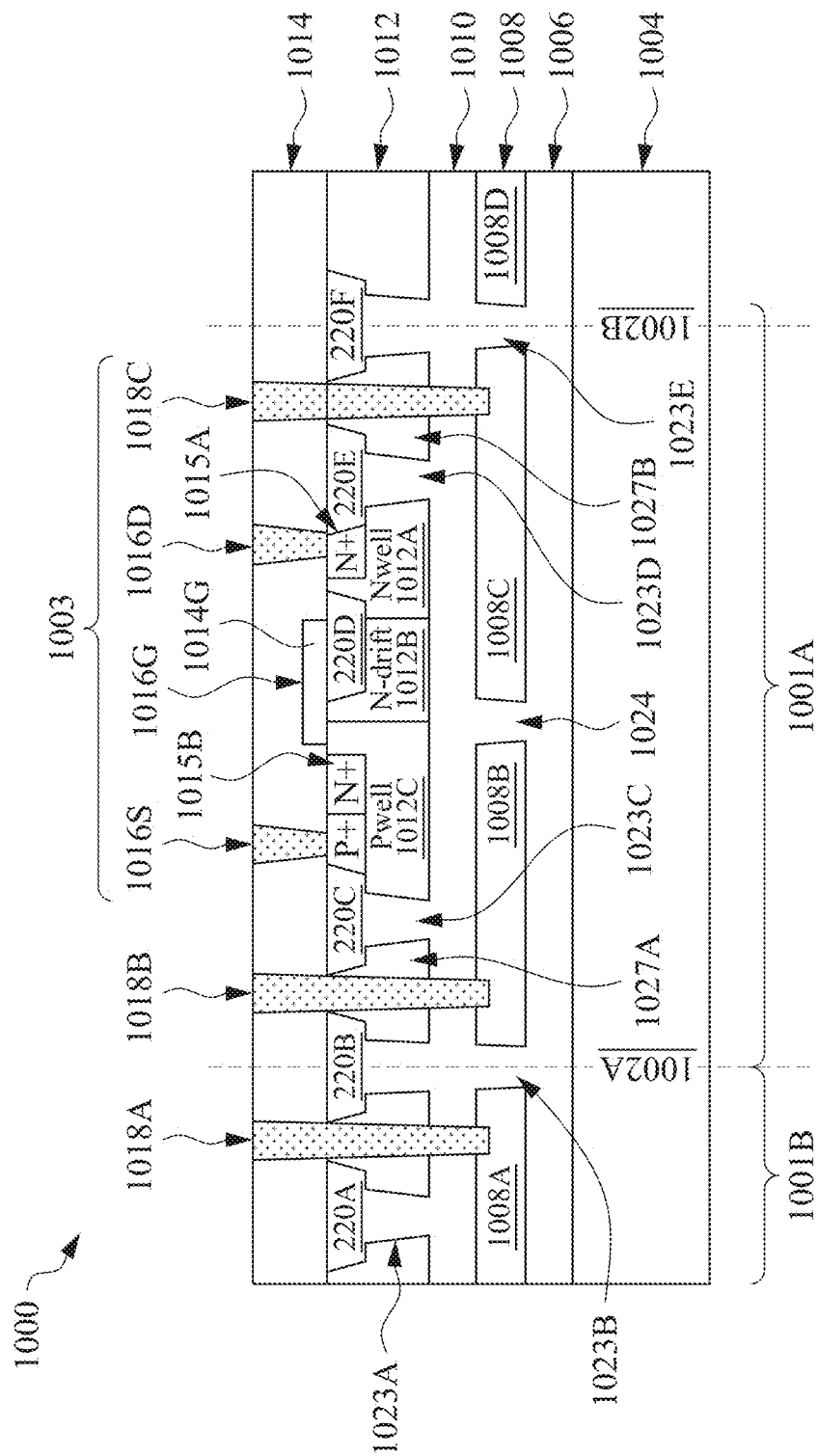
FIG. 10 is a cross-sectional view of an integrated circuit, in accordance with some embodiments.

FIG. 10 is a cross-sectional view of an integrated circuit 1000, in accordance with some embodiments. Integrated circuit 1000 is similar to integrated circuit 640, as described above in connection with FIG. 6B, but whereas FIG. 6B has a single bias pad 648A, integrated circuit 1000 has two bias pads 1008B and 1008C by a DTI 1024, as further described below. In integrated circuit 1000, a first cell 1001A and a second cell 1001B meet at a cell boundary 1002A. Cell boundary 1002A extends through DTI 1023B. Cell boundary 1002B extends through DTI 1023C. The film stack below transistor 1003 is as follows: a first oxide layer 1006 is deposited over a top surface of substrate 1004. A layer of bias pad material 1008 is deposited over a top surface of first oxide layer 1006. A second oxide layer 1010 is deposited over a top surface of the layer of bias pad material 1008. A layer of semiconductor material 1012 is deposited over a top surface of second oxide layer 1010, and includes doped wells for a transistor 1003. Shallow trench isolation structures (STI) extend through a top portion of layer of semiconductor material 1012, but do not extend to the top surface of second oxide layer 1010. Deep trench isolation structures (DTI) have three versions. A first version of a DTI, DTI 1023A, DTI 1023C, and DTI 1023D, extends through an entirety of the layer of semiconductor material 1012, down to second oxide layer 1010. A second version of a DTI, DTI 1023B and DTI 1023D, extends through the layer of semiconductor material 1012, the second oxide layer 1010, and the layer of bias pad material 1008, down to the first oxide layer 1006. The third version of a DTI, DTI 1024, extends from second oxide layer 1010, through layer of bias pad material 1008, down to first oxide layer 1006. DTI 1024 does not extend through the layer of semiconductor material 1012. DTI 1024 is entirely beneath transistor 1003. DTI 1024 separates, the low transistor 1003, the layer of bias pad material 1008 into two separate bias pads, bias pad 1008B and bias pad 1008C. Bias contact 1018B, in the first cell 1001A, extends through first ILD film 1014, the layer of semiconductor material 1012, and the second oxide layer 1010, down to bias pad 1008B. Bias contact 1018C extends through first ILD film 1014, the layer of semiconductor material 1012, and second oxide layer 1010 down to bias pad 1008C. Because bias pad 1008B and bias pad 1008C are separated and electrically isolated from each other by DTI 1024, bias pad 1008B and bias pad 1008C are configured to receive independent voltage setpoints beneath different sides of transistor 1003. Thus, bias pad 1008B is configured to apply a strong effect on P-doped source well 1012C, and bias pad 1008C is configured to apply a strong effect against N-doped drain well 1012A and N-type doped drift region 1012B below electrode 1014G. Bias contact 1018A in first cell 1001B is configured to receive an independent voltage setpoints from bias contacts 1018B and 1018C, and bias pads 1008B and 1008C, in first cell 1001A.

FIGS. 11A-11H are cross-sectional views of an integrated circuit during a manufacturing process, in accordance with some embodiments.

FIG. 11A is a cross-sectional view of an integrated circuit 1100 during the manufacturing process, in accordance with some embodiments. In integrated circuit 1100, a first cell 1101A is separated from a second cell 1101B at a cell boundary 1102. For both first cell 1101A and second cell 1101B, a first oxide layer 1106 is deposited over a substrate 1104. Deposition of the first oxide layer 1106 corresponds to operation 142 in method 140, described above. A layer of bias pad material 1108 is deposited over first oxide layer 1106 in both the first cell 1101A and the second cell 1101B. Deposition of the layer of bias pad material 1108 corresponds to operation 146 in method 140, described above. A second oxide layer 1110 is deposited over the layer of bias pad material 1108 in both first cell 1101A and second cell 1101B. Deposition of the second oxide layer corresponds to performance of operation 150 in method 140, described above. A layer of semiconductor material 1112 is deposited over the second oxide layer 1110 in both the first cell 1101A and the second cell 1101B. Deposition of the layer of semiconductor material 1112 corresponds to performance of operation 154 in method 140, described above. Oxide layers are deposited over substrates by, e.g., a variation of chemical vapor deposition (CVD) wherein silane (SiH$_4$) and oxygen molecules react to form SiO$_2$ films on a top surface of a substrate. The layer of semiconductor material 1112 is deposited by, e.g., CVD or epitaxial growth of the film using thermal decomposition of silane (SiH$_4$) or a silyl-halide (e.g., SiCl$_4$, SiBr$_4$, and so forth). In embodiments wherein the layer of bias pad material 1108 is a semiconductor material, deposition occurs in a manner analogous to the manner of deposition of the layer of semiconductor material 1112. In an embodiment wherein the layer of bias pad material 1108 is a metallic layer, the film deposition occurs by, e.g., sputtering of metal atoms from a metal target onto the first oxide layer 1106 to a thickness suitable for shielding a transistor from voltages in the substrate 1104.

FIG. 11B is a cross-sectional view of integrated circuit 1100 during a manufacturing process, according to some embodiments. In comparison to FIG. 11A, in FIG. 11B, a layer of patterning material 1113 has been deposited over a layer of semiconductor material 1112. The layer of patterning material 1113 has been exposed and developed to form openings 1123 therein. The blanket layers below the openings 1123 have been etched to form openings (trenches) for deep trench isolation structures which are further described below for FIG. 11C. A first type of opening 1121A extends through the layer of semiconductor material 1112 and stop against top surface of second oxide layer 1110. A short deep trench isolation structure 1122A (a short DTI) is formed by filling of a first type of opening 1121A with a dielectric material (e.g., silicon dioxide). A second type of opening 1121B extends through a layer of semiconductor material 1112, the second oxide layer 1110, and the layer of bias pad material 1108 to form isolated bias pads. A long deep trench isolation structure 1122B (a long DTI) is formed by filling a second type of opening 1121B with a dielectric material. In some embodiments, the second type of opening 1121B extends down to the first oxide layer 1106. In some embodiments, the second type of opening 1121B extends down into the layer of bias pad material 1108, but not through to the first oxide layer 1106. A depth of the second type of opening 1121B is related to at least the selectivity of the etch process for the layer of bias pad material with respect to the etch rate of the second oxide layer 1110, and/or the layer of semiconductor material. In some embodiments, the depth of the second type of opening 1121B is also related to the process conditions for forming the second type of opening to achieve a profile of the second type of opening which does not reduce the active area of the cell below a circuit design specification.

Figure 11C:
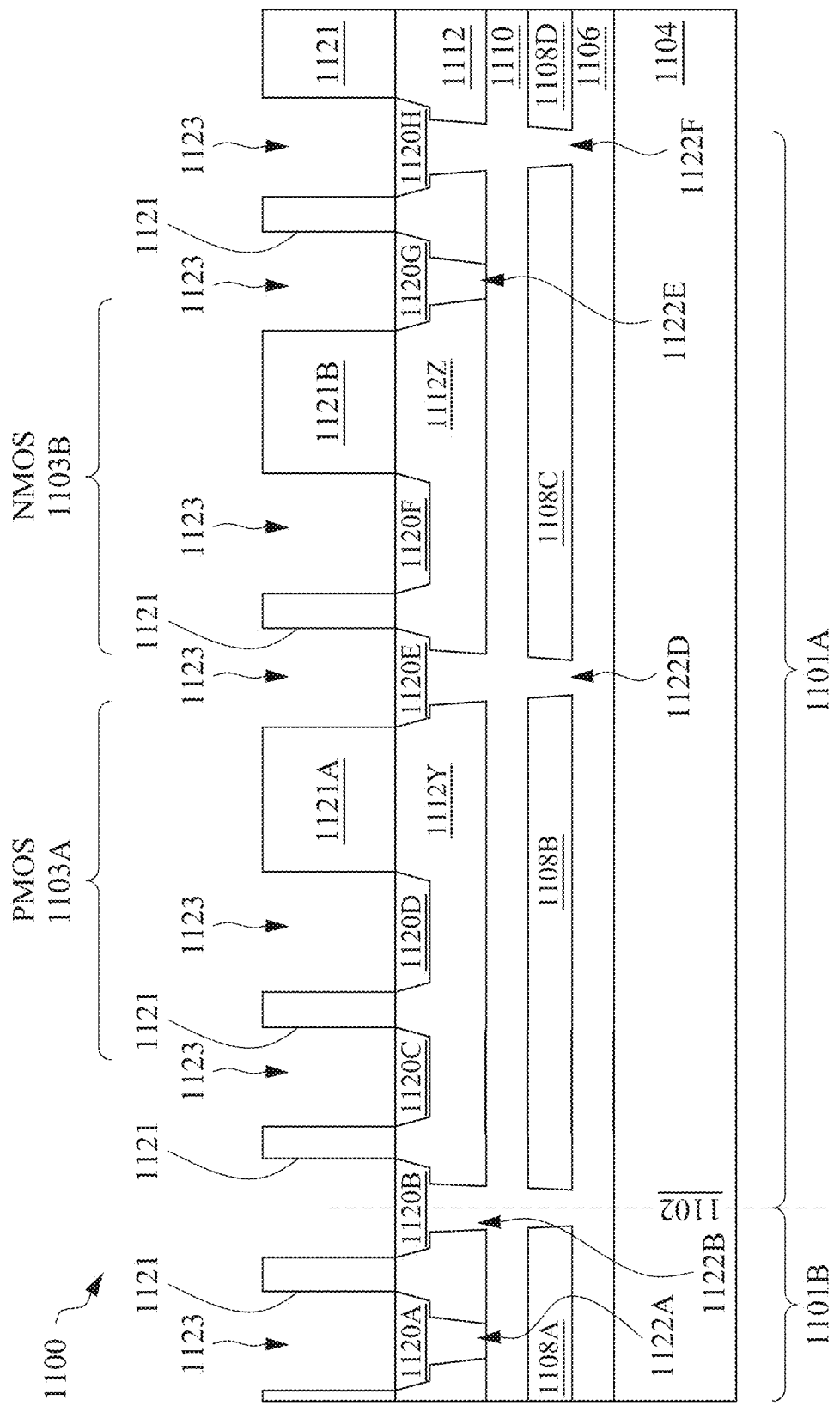

FIG. 11C is a cross-sectional view of integrated circuit 1100 during a manufacturing process, in accordance with some embodiments of the present disclosure. In comparison to FIG. 11B, FIG. 11C includes isolation structure trenches, e.g., each of the first type of opening 1121A, and the second type of opening 1121B, which have been filled with a dielectric material to form short DTIs 1122A and long DTIs 1122B. After filling the openings with dielectric material, the wafer surface was planarized (by, e.g., chemical mechanical polishing (CMP)) to expose the top surface of the layer of semiconductor material 1112 between the different filled isolation structure trenches.

Long DTIs such as long DTI 1122B separate bias pads from each other. For example, bias pad 1108A in second cell 1101B is separated from bias pad 1108B across cell boundary 1102, where long DTI 1122B is located at the cell boundary 1102. Bias pad 1108C is separated from bias pad 1108B by a long DTI which separates PMOS transistor, or first transistor 1103A, from NMOS or second transistor 1103B. Another of second type of opening 1121B separates bias pad 1108C from bias pad 1108D.

In FIG. 11C, a layer of patterning material 1121 has been added over a top surface of the layer of semiconductor material. A set of openings 1123 in the layer of patterning material 1121 corresponds with locations of shallow trench isolation structures (STI) in integrated circuit 1100. Patterning material portion 1121Y masks active area 1112Y of the layer of semiconductor material 1112. Patterning material portion 1121Z masks active area 1112Z of the layer of semiconductor material 1112. Active areas 1112Y and 1112Z are undoped in FIG. 11C because dopants are added to the layer of semiconductor material after formation of STI (1120A-1120H) in the layer of semiconductor material 1112. In some embodiments, the STI at the top of a long DTI extend around an active area of a cell. In FIG. 11C, therefore, STI 1120B and 1120E appear to be different in a cross-sectional view of the first cell 1101A, but are actually a single STI which extends around the perimeter of active area 1112Y and around the bias pad 1108B. Similarly, DTI 1122B and 1122E extend around the perimeter of active area 1112Y and bias pad 1108B. Similarly, Bias pad 1108C and active area 1112Z are surrounded by a single STI, shown as STI 1120E and 1120H, and by a single long DTI shown as DTI 1122D and 1122F (see also FIG. 6A, isolation structure 604, and FIG. 6B DTI 662A and 662C.

STI 1120A-1120H are formed oxidizing the top surface of the layer of semiconductor material. In some embodiments, an oxygen rich plasma is used to oxidize exposed upper portions of the layer of semiconductor material 1112 within the openings 1123 in the layer of patterning material 1113. In some embodiments, an etch process is performed to remove an upper portion of the layer of semiconductor material 1112 from the bottom of the openings 1123, and the openings in the layer of semiconductor material are filled with dielectric material, and planarized with a CMP process to expose the layer of semiconductor material.

Figure 11D:
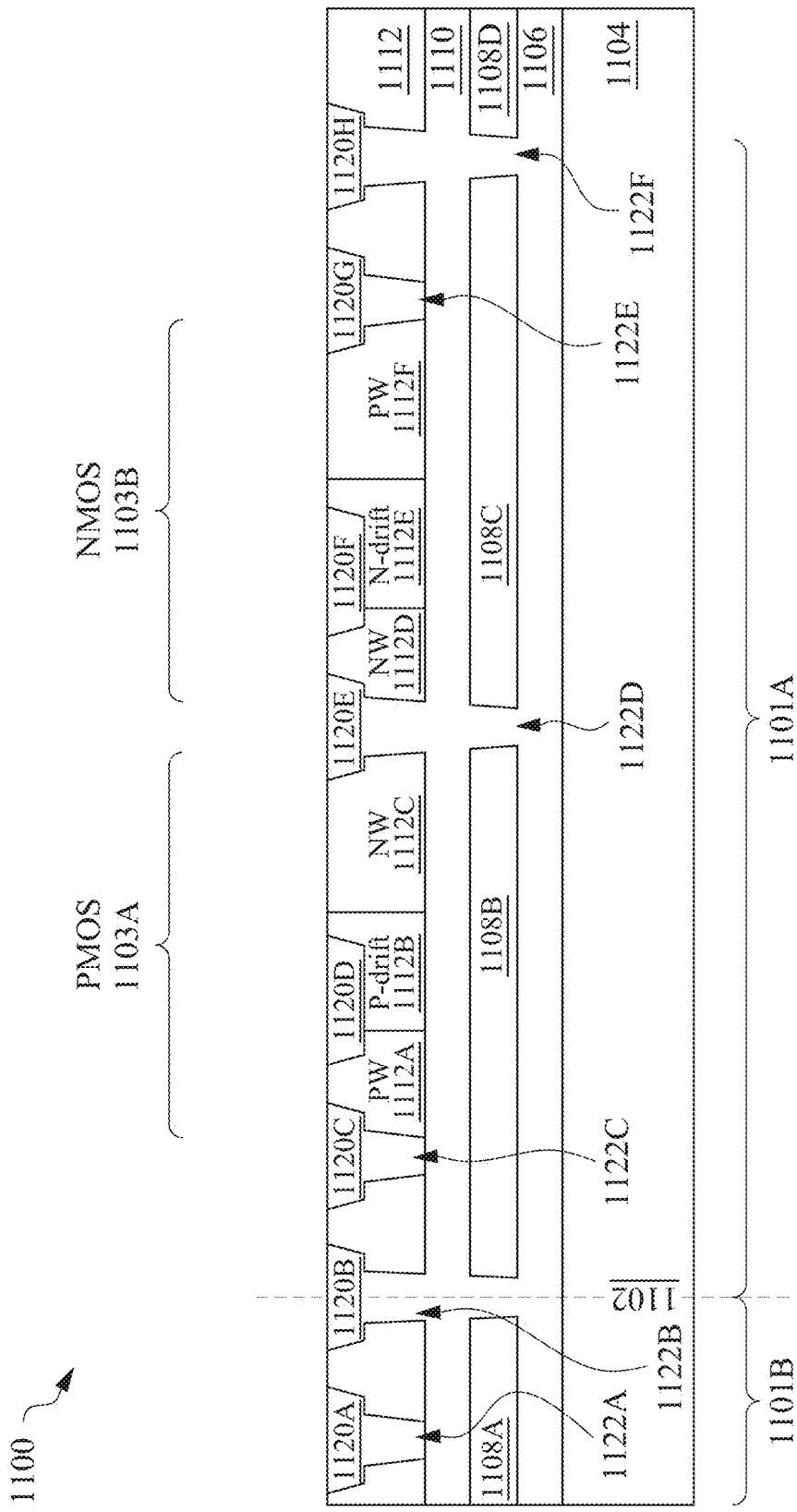
Figure 11E:
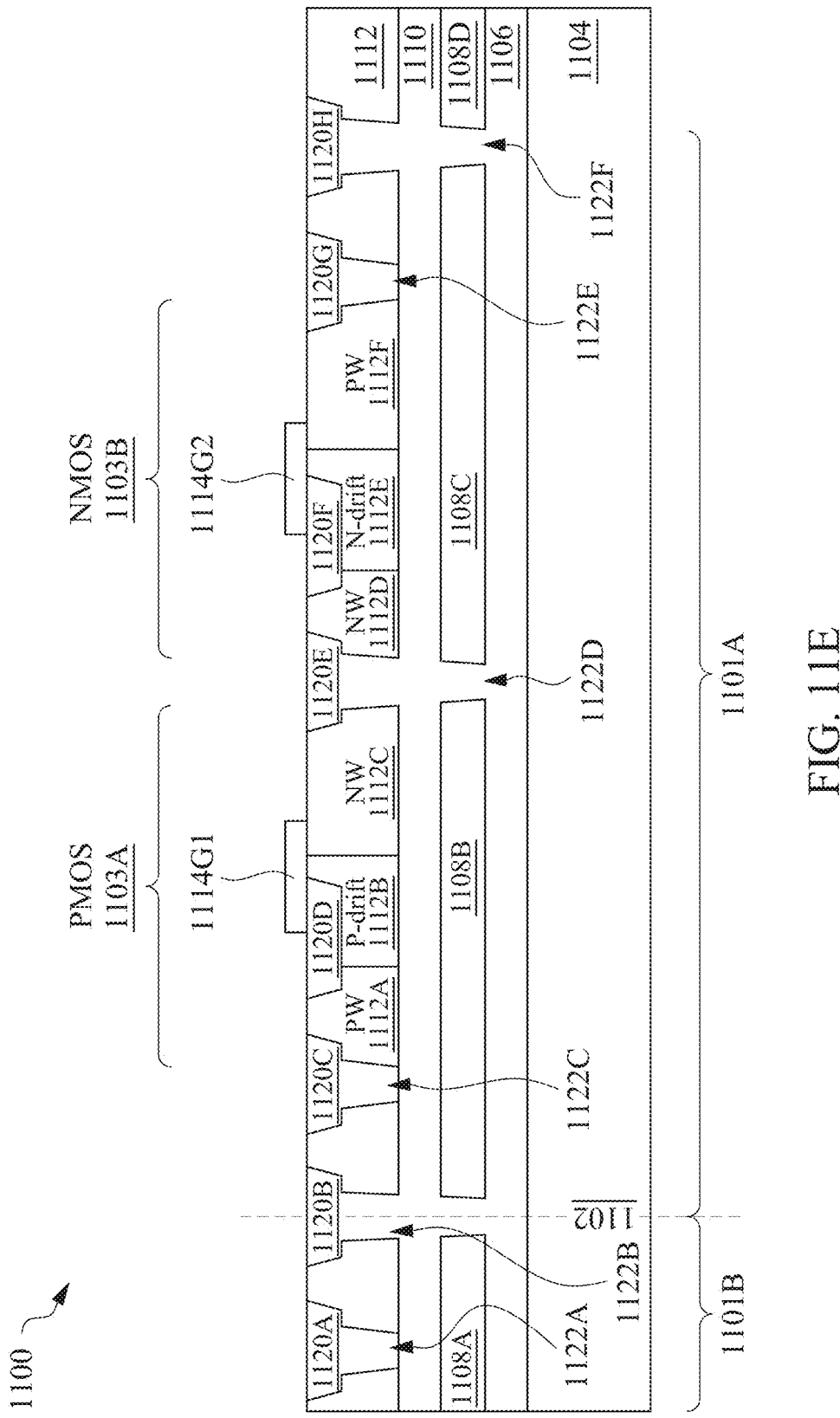

In comparison to FIG. 11C, in FIG. 11D, the active areas 1112Y and 1112Z have been implanted with P-type and N-type dopant atoms to form doped regions 1112A-1112F for the active areas. For a first transistor 1103A, a PMOS transistor, P-doped well 1112A is separated from an N-doped well 1112C by a P-doped drift region 1112B. STI 1120D separates the top surface of P-doped well 1112A from the top surface of P-doped drift region 1112B. No STI separates the top surface of P-doped drift region 1112B from the top surface of N-doped well 1112C. For second transistor 1103B, an NMOS transistor, an N-doped well 1112D is separated from a P-doped well 1112F by an N-doped drift region 1112E. An STI 1120F separates the top surface of N-doped well 1112D form the top surface of N-doped drift region 1112E. No STI separates the top surface of the N-doped drift region 1112E from the top surface of P-doped well 1112F. The addition of doped regions in two different wells in the layer of semiconductor material 1112 corresponds to the performance of operation 156 in method 140, described above. In some embodiments, steps which are also part of operation 156 include steps of adding dopants for source/drain regions, and/or LDD regions to the layer of semiconductor material 1112 as part of making the transistors (e.g., first transistor 1103A and second transistor 1103B), as described below.

FIG. 11E is a cross-sectional view of integrated circuit 1100, in accordance with some embodiments of the present disclosure. In comparison to FIG. 11D, FIG. 11E depicts the formation of gate electrode 1114G1, in first transistor 1103A, and gate electrode 1114G2, in second transistor 1103B. Gate electrodes 1114G1 and 1114G2 are formed by depositing a blanket layer of gate dielectric material (not shown) over top surface of the layer of semiconductor material 1112 and the STI 1120A-1120H, and depositing a layer of gate electrode material (e.g., polysilicon, silicon germanium, and so forth) over the layer of gate dielectric material (not shown). A layer of patterning material is deposited over the layer of gate electrode material, and a pattern transferred thereto, before exposed portions of the layer of gate dielectric material and the gate electrode material are removed by an etch process to expose the layer of semiconductor material 1112, and the STI 1120A-1120H, leaving gate electrodes 1114G1 and 1114G2 behind. Gate electrode 1114G1 extends over part of the top surface of STI 1120D and over the top surface of P-doped drift region 1112B, and over part of the top surface of N-doped well 1112C. Gate electrode 1114G2 extends over part of a top surface of STI 1120F, over the top surface of N-doped drift region 1112E, and over part of the top surface of P-doped well 1112F.

Figure 11F:
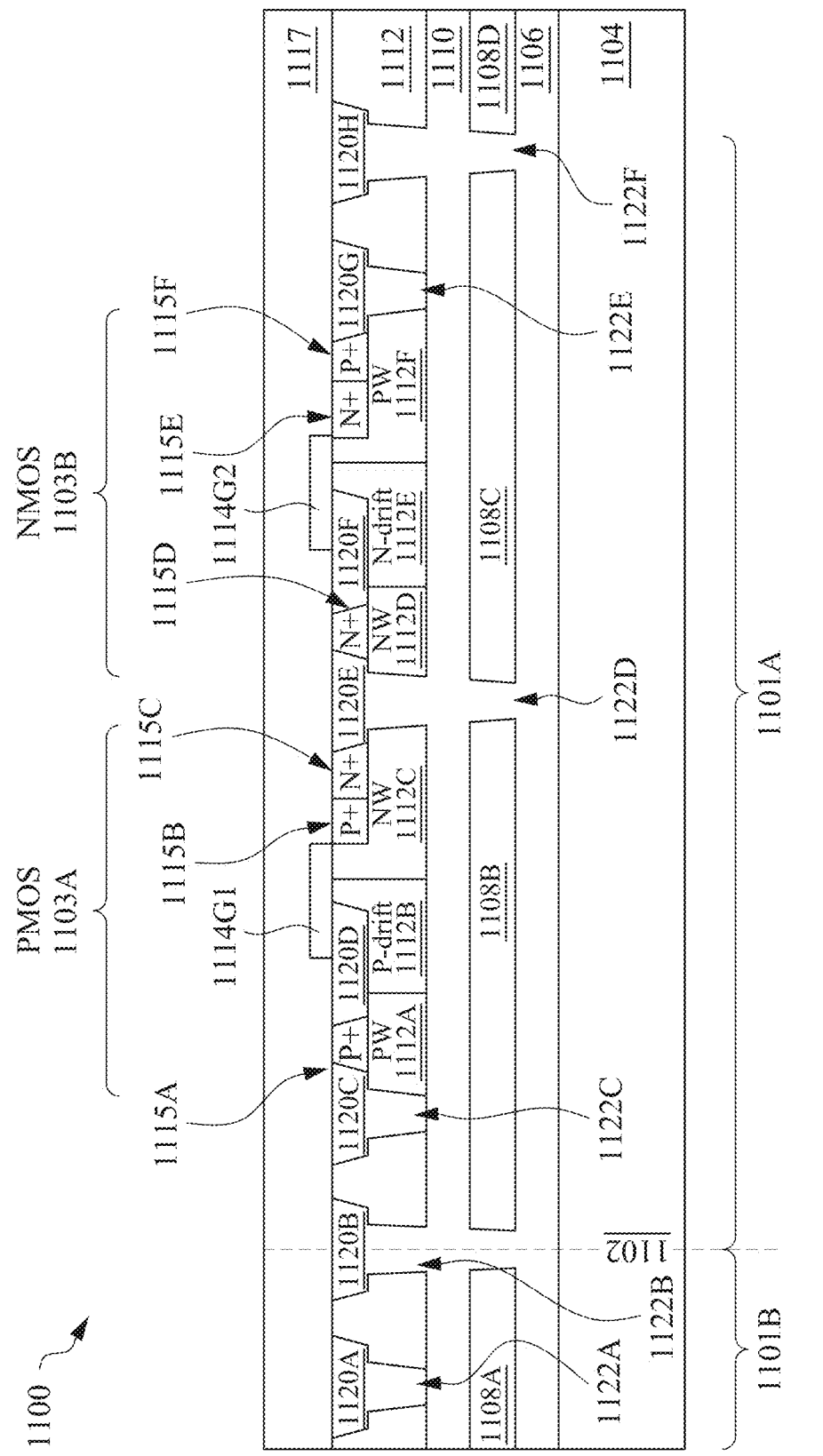

FIG. 11F is a cross-sectional diagram of an integrated circuit 1100 during a manufacturing process, in accordance with some embodiments of the present disclosure. In FIG. 11F, heavily doped regions 1115A and 1115F have been formed in first cell 1103A. Doped regions reduce contact resistance between contacts and a transistor. According to some embodiments, the addition of heavily doped regions of the integrated circuit corresponds to performance of operation 156 in method 140. In some embodiments, dopants are added to the layer of semiconductor material using multiple doping operations, such as adding P-type dopants in a first dopant adding operation, and N-type dopants in a second dopant-adding operation. In some embodiments, dopants are added by adjusting the energy of dopant atoms in an implant process. Lower implant energies are used in order to retain the implanted dopant atoms to the upper portion of the doped wells where the heavily doped regions are located. For example, heavily doped region 1115A is located in an upper portion of P-doped well 1112A, and is physically separated form P-doped drift region 1112B. Similarly, heavily doped regions 1115B and 1115C are located in an upper region of N-doped well 1112C, and are physically separated from P-doped drift region 1112B. Heavily doped region 1115A has a net P-type doping profile with a higher concentration of P-type dopants than P-doped well 1112A. Heavily doped 1115C has a net N-type doping profile, with a larger concentration of N-type dopants than in N-doped well 1112C. Heavily doped region 1115B has a net P-type doping profile and adjoins a side of heavily doped region 1115C within N-doped well 1112C. Heavily doped region 1115B approaches, but does not extend below, gate 1114G1.

Heavily doped region 1115D is located in an upper region of N-doped well 1112D, and has a higher concentration of N-type dopants than the N-doped well 1112D outside the heavily doped region 1115D. Heavily doped region 1115D is physically separated from N-doped drift region 1112E. N-doped drift region is physically separated from the heavily doped regions in the P-doped well 1112F: heavily doped regions 1115E and 1115F. Heavily doped region 1115F is a P-doped region in an upper region of P-doped well 1112F, and heavily doped region 1115E is adjacent to heavily doped region 1115F in the upper region of P-doped well 1112F. Heavily doped region 1115E has a net N-type doping profile and separates P-doped heavily doped region 1115F from the portion of P-doped well 1112F directly below gate electrode 1114G2 and the P/N junction directly below gate electrode 1114G2.

When adding the dopants to the source/drain regions, or to one or more heavily doped region, in the layer of semiconductor material, a layer of patterning material is deposited over a top surface of the layer of semiconductor material (and the DTIs extending through the layer of semiconductor material), exposing a portion of one or more doped wells within the footprint of a transistor. When adding heavily doped regions such as heavily doped region 1115A in well 1112A, the local density of P-type dopants is increased within the heavily doped region by addition of extra P-type dopants in an implant process. When forming heavily doped region 1115B in well 1112C, P-type dopants are added to first neutralize the net N-type dopant surplus in the top region of well 1112C, and then produce a surplus or excess of P-type dopants within the heavily doped region 1115B. Thus, according to some embodiments, the first quantity of dopants is added to heavily doped region 1115A, and a second quantity of P-type dopants is added to heavily doped region 1115B, where the second quantity of P-type dopants is larger than the first quantity of the P-type of dopant because of the different composition of the wells where the heavily doped regions are located. In a similar fashion, the addition of dopants to heavily doped region 1115D, located at a top region of well 1112D, requires a smaller total quantity of N-type dopants than the addition of N-type dopants to form heavily doped region 1115E in well 1112F of second transistor 1103B. Heavily doped region 1115C in well 1112C is formed by adding N-type dopants to the top region of the well 1112C. Similarly, the formation of heavily doped region 1115F in well 1112F occurs by adding P-type dopants to the top region of the well 1112F.

Figure 11G:
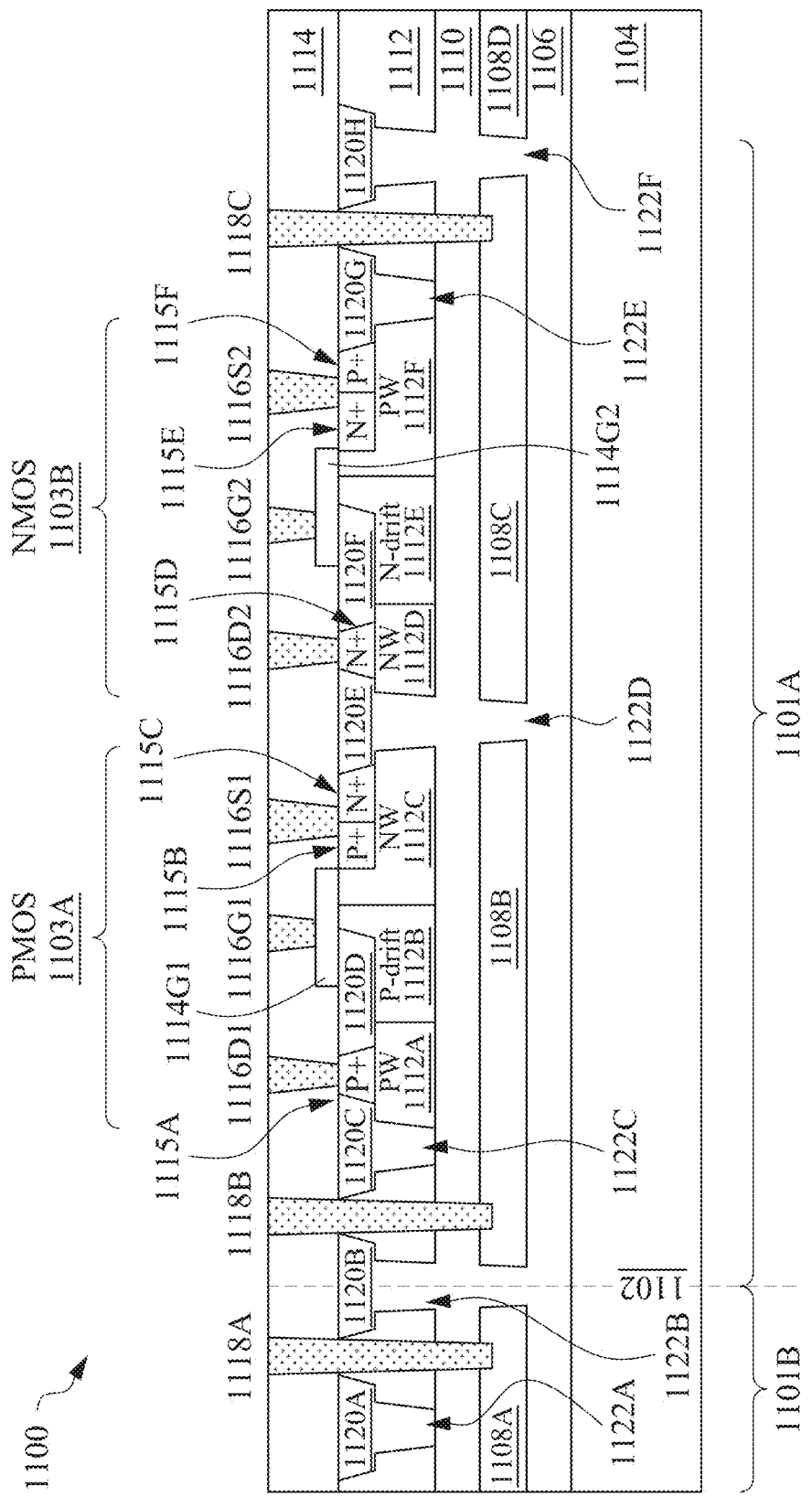

FIG. 11G is a cross-sectional view of integrated circuit 1100 during a manufacturing process, in accordance with some embodiments of the present disclosure. In comparison to FIG. 11F, FIG. 11G depicts a plurality of contacts which have been formed through the film stack of integrated circuit 1100. A first set of contacts, bias contacts 1118A, bias contact 1118B, and bias contact 1118C, extend through first ILD film 1114, the layer of semiconductor material 1112, and the second oxide layer 1110, down to bias pads. Bias contact 1118A electrically connects to bias pad 1108A. Bias contact 1118B electrically connects to bias pad 1108B. Bias contact 1118C electrically connects to bias pad 1108C. Bias pad 1108B is under an entirety of first transistor 1103A. Bias pad 1108C under an entirety of second transistor.

Transistor contacts for first transistor 1103A include drain contact 1116D, which electrically connects to heavily doped region 1115A, gate contact 1116G, which electrically connect to gate electrode 1114G1, and source contact 1116S1, which electrically connects to heavily doped regions 1115B and 1115C in N-well 1112C of first transistor 1103A. Second transistor 1103B has drain transistor 1116D2 which extends through first ILD film 1114 to heavily doped region 1115D in N-doped well 1112D. Gate contact 1116 G2 extends through first ILD film down to electrode 1114G2. Source contact 1116S2 extends through first ILD film 1114 down to heavily doped regions 1115E and region 1115F in well 1112F. According to some embodiments, bias contacts are manufactured in separate operations for pitching contact openings and filling the contact openings. The formation of transistor contacts and bias contacts corresponds with the performance of operation 164 in method 140, as described above.

Figure 11H:
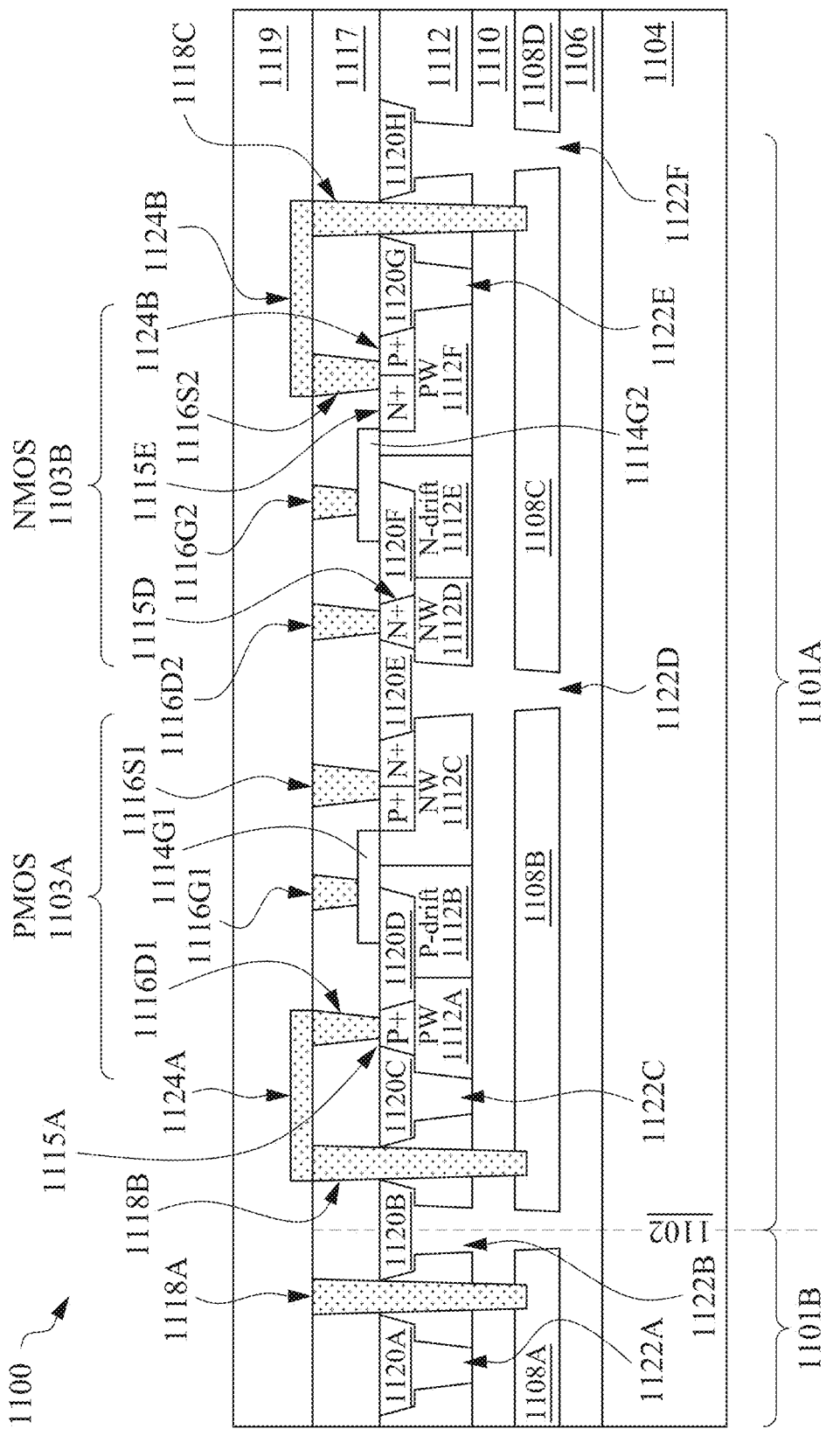

FIG. 11H is a cross-sectional view of integrated circuit 1100, in accordance with some embodiments. In comparison to FIG. 11G, FIG. 11H depicts a first portion of an interconnection structure between contacts. A conductive line 1124A extends across a top surface of the first ILD film 1117 from bias contact 1118B to drain contact 1116D1 in first transistor 1103A. Similarly, conductive line 1124B extends from source contact 1116S2 in second transistor 1103B to bias contact 1118C. Thus, operation of a transistor triggers both the movement of carriers through the channel region between the source and drain contact and the application of a voltage, or the storage of charge, in a bias pad beneath the transistor as the transistor operates. The conductive lines 1124A and 1124B serve as bridges to promote the operation of the bias pads without additional transistors or logical elements in an integrated circuit. Conductive lines 1124A and 1124B are within an ILD layer 1119 deposited over ILD layer 1117.

FIGS. 12A-12D are cross-sectional views of an integrated circuit during a manufacturing process, in accordance with some embodiments.

Figure 12A:
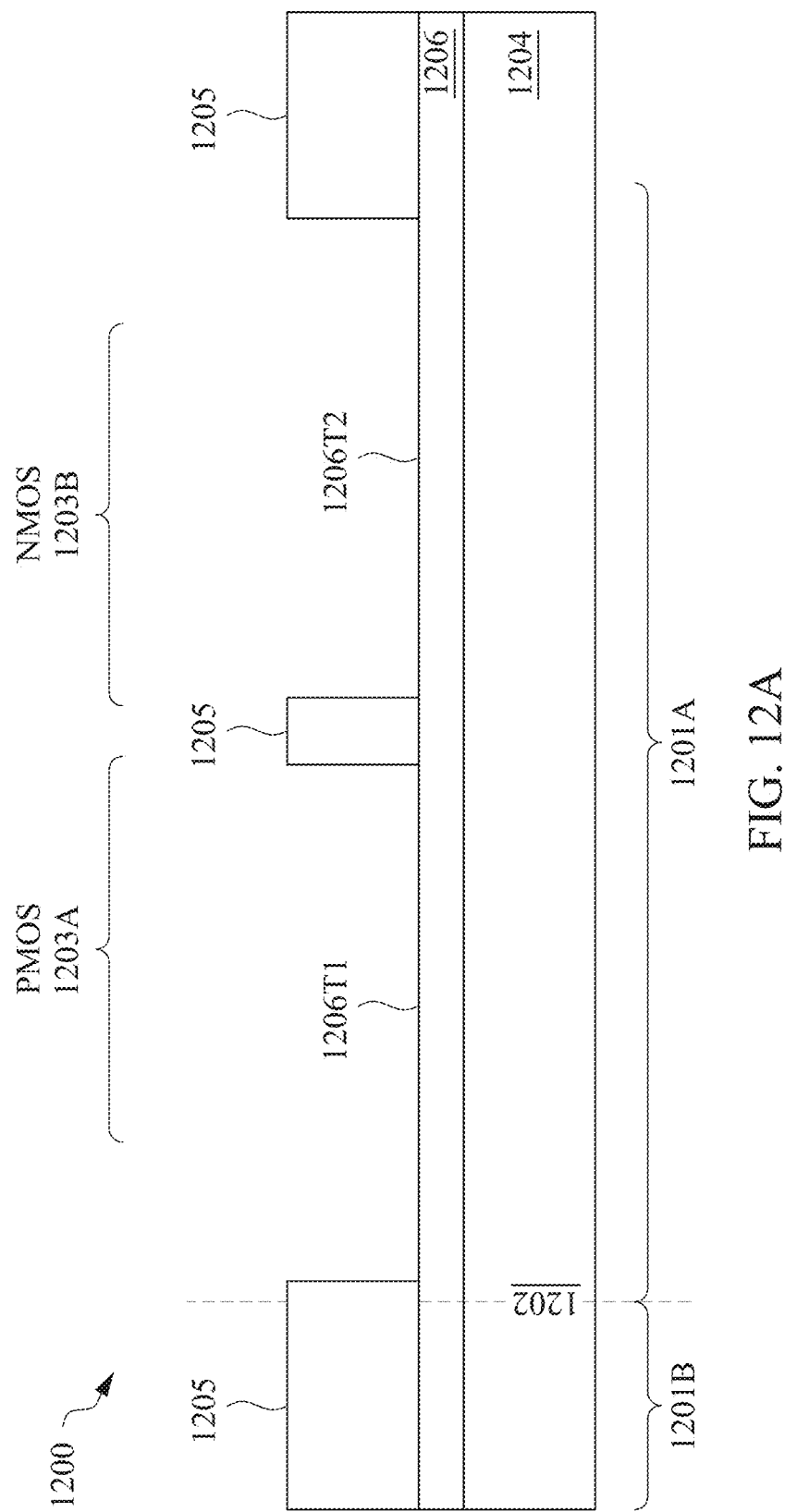

FIG. 12A is a cross-sectional view of an integrated circuit 1200, in accordance with some embodiments of the present disclosure. In integrated circuit 1200, the first oxide layer 1206 has been deposited over a substrate 1204. In integrated circuit 1200, a first cell 1201A is undergoing first oxide layer thinning, while a second cell 1201B of the integrated circuit is protected from first oxide layer thinning by a layer of masking material 1205. The first cell 1210A is separated from the second cell 1210B at a cell boundary 1202. Must material 1205 has been deposited over a top surface of first oxide layer 1206. In first cell 1201A, a first top surface portion 1206T1 and a second top surface portion 1206T2 are exposed by openings in masking material 1205. First top surface portion 1206T1 corresponds to first transistor 1203A. Second top surface portion 1206T2 corresponds to a part of the oxide layer below second transistor 1203B. First oxide layer thinning occurs by etching first top surface portion 1206T1 and second top surface portion 1206T2 by an etching process, as previously described in optional operation 144 of method 140.

FIG. 12B is a cross-sectional view of an integrated circuit 1220, in accordance with some embodiments. Elements of integrated circuit 1220 which have a similar structure and function as integrated circuit 1200, as described in FIG. 12A, of a same identifying numeral. Differences between integrated circuit 1220 and integrated circuit 1200 are described below. In integrated circuit 1220, only first transistor 1203A has been exposed first top surface portion 1206T1 for first oxide thinning according to operation 144 of method 140, as described above. The first oxide layer 1206 for second transistor 1203B is protected from first oxide thinning by masking material 1205.

Figure 12C:
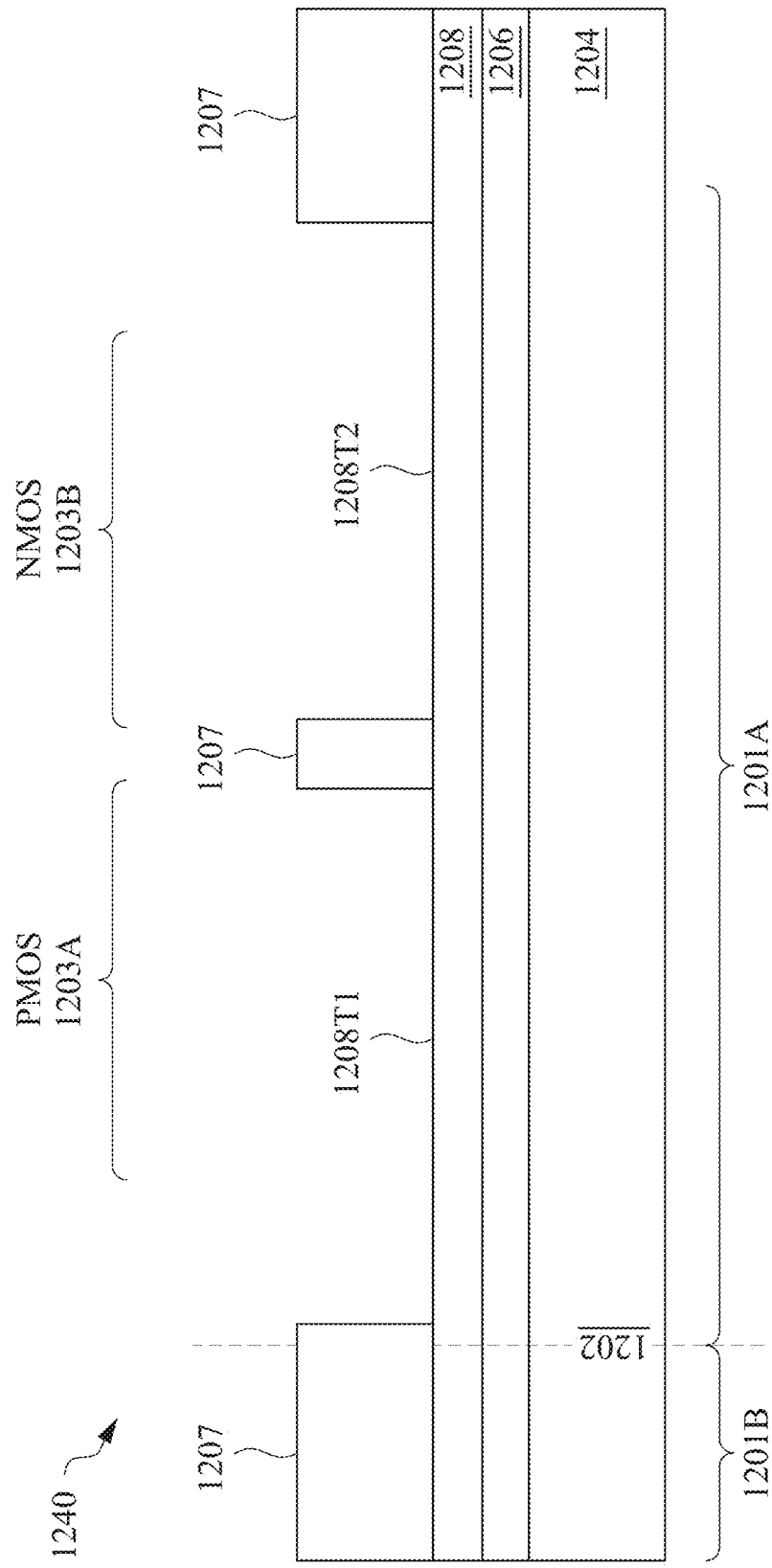

FIG. 12C is a cross-sectional view of integrated circuit 1240, in accordance with some embodiments of the present disclosure. In integrated circuit 1240, elements which have a similar structure and function as integrated circuit 1200 a same identifying numeral. A layer of bias pad material 1208 has been deposited over first oxide layer 1206. A layer of masking material 1207 has been deposited over the layer of bias pad material 1208. Openings in the layer of masking material 1207 corresponds to bias layer material portions 1208T1 and 1208T2 for first transistor 1203A and second transistor 1203B. Thinning of the layer of bias pad material 1208 is performed according to optional operation 148 as described above in method 140. Generally, thinning of layers of bias pad material is performed by etching with aqueous etchants or a dry, or plasma etch process. Further details about the chemistry and other considerations associated with bias layer thinning are described previously in operation 148 of method 140.

Figure 12D:
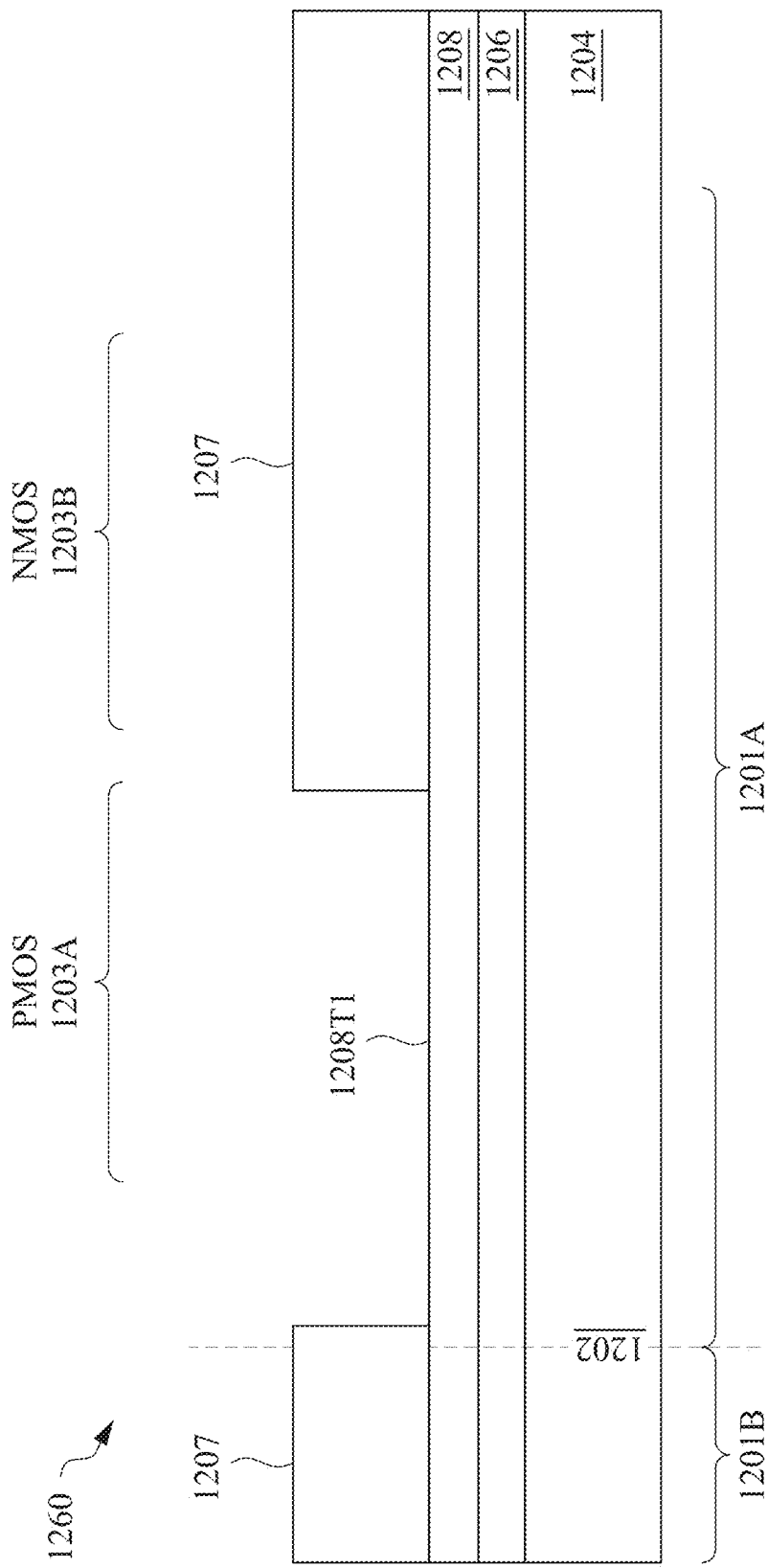

FIG. 12D is a cross-sectional view of an integrated circuit 1260, in accordance with some embodiments of the present disclosure. Elements of integrated circuit 1260 which have a similar structure or function as elements of integrated circuit 1240 have a same identifying reference. Masking material 1207 is over the layer of bias pad material 1208. Masking material 1207 covers the layer of bias pad material 1208 in the region of sections at second transistor 1203B, but an opening in masking material in 1207 exposes bias layer material portions 1208T1 in the footprint of the first transistor 1203A. In accordance with some embodiments, the layer of bias pad material below PMOS transistors in an integrated circuit cell exposed for thinning, while in most transistor is protected by the masking material. In some embodiments, the layer of bias pad material below NMOS transistors is exposed for thinning while PMOS transistors are protected by the masking material.

Aspects of the present disclosure relate to a semiconductor device, which includes a buried oxide layer over a substrate, a layer of semiconductor material over the buried oxide layer, the layer of semiconductor material including a plurality of doped regions, and a transistor, wherein the transistor comprises a gate electrode and the plurality of doped regions, and an isolation region in the layer of semiconductor material; an inter layer dielectric (ILD) material over the layer of semiconductor material and the gate electrode; a first bias contact extending through the ILD material and the isolation region to the buried oxide layer; and an interconnection structure electrically connected to the buried oxide layer by the first bias contact. In some embodiments, the semiconductor device further includes a first bias pad in the buried oxide layer, wherein the first bias pad comprises an electrically conductive material. In some embodiments, the first bias contact is isolated from the layer of semiconductor material by an isolation structure extending through the layer of semiconductor material. In some embodiments, the semiconductor device further includes a second bias pad within the buried oxide layer, wherein the second bias pad is between a second transistor and the substrate, the second bias pad is electrically isolated, within the buried oxide layer, from the first bias pad by a deep trench isolation structure (DTI), wherein the second bias pad is electrically connected to the interconnection structure of the integrated circuit by a second bias contact. In some embodiments, the semiconductor device further includes a second transistor, a bias pad below the second transistor, and a second bias contact electrically connected to the second bias pad, wherein the first bias pad has a first bias pad thickness and the second bias pad has a second bias pad thickness smaller than the first bias pad thickness. In some embodiments, in the layer of semiconductor material, the first bias contact and the second bias contact are each separated from the layer of semiconductor material by an isolation structure in the layer of semiconductor material. In some embodiments, the semiconductor device further includes a second bias contact extending through the ILD material, the layer of semiconductor material, and the buried oxide layer to the substrate, and electrically connected to the interconnection structure of the integrated circuit above the ILD material. In some embodiments of the semiconductor device, the second bias contact is separated from the layer of semiconductor material by a deep trench isolation structure (DTI). In some embodiments, the semiconductor device further includes a plurality of pillar-type bias contacts extending through the isolation region. In some embodiments, the first bias contact further comprises a bar-type bias contact extending through an isolation region of the integrated circuit and electrically connected to the first bias pad. In some embodiments, the isolation region extends around an entirety of a first transistor of the integrated circuit. In some embodiments, the first bias pad is electrically connected to a voltage source by the interconnection structure.

Aspects of the present disclosure relates to a semiconductor device which includes a buried oxide layer over a substrate; a layer of semiconductor material over the buried oxide layer; a transistor having a source well and a drain well in the layer of semiconductor material; a first bias pad within the buried oxide layer between the source well and the substrate; a second bias pad within the buried oxide layer between the drain well and the substrate; a first deep trench isolation structure (DTI) loop, wherein the first bias pad is surrounded by the first DTI loop within the buried oxide layer; and a second DTI loop, wherein the second bias pad is surrounded, within the buried oxide layer, by the second DTI loop, and the first DTI loop and the second DTI loop share a central DTI segment. In some embodiments, the first bias pad and the second bias pad are configured to receive different voltages. In some embodiments, the transistor is between the central DTI segment and an inter layer dielectric (ILD) material.

Aspects of the present disclosure relate to a method of making an integrated circuit, which includes operations of surrounding a first bias pad with dielectric material of a buried oxide layer; adding dopants to a layer of semiconductor material over the first bias pad; depositing a gate dielectric and a gate electrode material over a top surface of the layer of semiconductor material; etching the gate dielectric and the gate electrode material to isolate a gate electrode over the layer of semiconductor material; depositing an inter layer dielectric (ILD) material over the gate electrode and the layer of semiconductor material; etching at least one bias contact opening down to the first bias pad; filling the at least one bias contact opening with a bias contact material; electrically connecting at least one bias contact to an interconnect structure of the semiconductor device. In some embodiments of the method, surrounding the first bias pad with dielectric material of the buried oxide layer further includes depositing a first oxide layer over a substrate; depositing a layer of bias pad material over the first oxide layer; depositing a second oxide layer over the layer of bias pad material; and isolating the first bias pad from a remainder of the layer of bias pad material by etching a deep trench isolation structure opening through the second oxide layer and the layer of bias pad material, and filling the deep trench isolation structure opening with a dielectric material, wherein a deep trench isolation structure extends around a portion of the layer of semiconductor material. In some embodiments, adding dopants to the layer of semiconductor material further includes adding dopants to a source well and a drain well of the transistor, and further comprises etching substrate contact openings from the first ILD film down to the substrate, and filling the substrate contact openings with a conductive material. In some embodiments, the method further includes surrounding a second bias pad within the buried oxide layer with dielectric material, the second bias pad being below a different transistor than the first bias pad. In some embodiments, the first bias pad has a first bias pad thickness, and the second bias pad has a second bias pad thickness, and the method further includes modifying the first bias pad thickness to be different from the second bias pad thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a buried oxide layer over a substrate;
   a layer of semiconductor material over the buried oxide layer, the layer of semiconductor material including a plurality of doped regions;
   a transistor, wherein the transistor comprises a gate electrode and the plurality of doped regions;
   an isolation region in the layer of semiconductor material;
   an inter layer dielectric (ILD) material over the layer of semiconductor material and the gate electrode;
   a first bias contact extending through the ILD material and the isolation region to the buried oxide layer; and
   an interconnection structure electrically connected to the buried oxide layer by the first bias contact.

2. The semiconductor device of claim 1, further comprising a first bias pad in the buried oxide layer, wherein the first bias pad comprises an electrically conductive material.

3. The semiconductor device of claim 2, further comprising a second bias pad within the buried oxide layer, wherein the second bias pad is between a second transistor and the substrate, the second bias pad is electrically isolated, within the buried oxide layer, from the first bias pad by a deep trench isolation structure (DTI), wherein the second bias pad is electrically connected to the interconnection structure of the semiconductor device by a second bias contact.

4. The semiconductor device of claim 3, wherein, in the layer of semiconductor material, the first bias contact and the second bias contact are each separated from the layer of semiconductor material by an isolation structure in the layer of semiconductor material.

5. The semiconductor device of claim 2, wherein the first bias pad is electrically connected to a voltage source by the interconnection structure.

6. The semiconductor device of claim 1, wherein the first bias contact is isolated from the layer of semiconductor material by an isolation structure extending through the layer of semiconductor material.

7. The semiconductor device of claim 1, further comprising a second transistor, a bias pad below the second transistor, and a second bias contact electrically connected to the second bias pad, wherein the first bias pad has a first bias pad thickness and the second bias pad has a second bias pad thickness smaller than the first bias pad thickness.

8. The semiconductor device of claim 1, further comprising a second bias contact extending through the ILD material, the layer of semiconductor material, and the buried oxide layer to the substrate, and electrically connected to the interconnection structure of the semiconductor device above the ILD material.

9. The semiconductor device of claim 8, wherein the second bias contact is separated from the layer of semiconductor material by a deep trench isolation structure (DTI).

10. The semiconductor device of claim 1, further comprising a plurality of pillar-type bias contacts extending through the isolation region.

11. The semiconductor device of claim 10, wherein the isolation region extends around an entirety of a first transistor of an integrated circuit of the semiconductor device.

12. The semiconductor device of claim 2, wherein the first bias contact further comprises a bar-type bias contact extending through an isolation region of the semiconductor device and electrically connected to the first bias pad.

13. A semiconductor device, comprising:
    a buried oxide layer over a substrate;
    a layer of semiconductor material over the buried oxide layer;
    a transistor having a source well and a drain well in the layer of semiconductor material;
    a first bias pad within the buried oxide layer between the source well and the substrate;
    a second bias pad within the buried oxide layer between the drain well and the substrate;
    a first deep trench isolation structure (DTI) loop, wherein the first bias pad is surrounded by the first DTI loop within the buried oxide layer; and
    a second DTI loop surrounding the second bias pad within the buried oxide layer, the first DTI loop and the second DTI loop sharing a central DTI segment.

14. The semiconductor device of claim 13, having a first voltage source and a second voltage source, wherein the first bias pad is electrically connected to the first voltage source and the second bias pad is electrically connected to the second voltage source, wherein the first voltage source and the second voltage source have different voltages.

15. The semiconductor device of claim 13, wherein the transistor is between the central DTI segment and an inter layer dielectric (ILD) material.

16. A semiconductor device, comprising:
- a buried oxide layer over a substrate;
- a layer of semiconductor material over the buried oxide layer;
- a transistor having a source well and a drain well in the layer of semiconductor material;
- a first bias pad within the buried oxide layer between the source well and the substrate;
- a second bias pad within the buried oxide layer between the drain well and the substrate;
- a first deep trench isolation structure (DTI), wherein the first bias pad is separated from the second bias pad by the first DTI; and
- a first bias contact extending through the semiconductor layer and partially through the buried oxide layer, wherein the first bias contact is electrically connected to the first bias pad.

17. The semiconductor device of claim 16, further comprising a substrate contact, wherein the substrate contact extends through the first DTI, and the substrate contact is electrically connected to the substrate.

18. The semiconductor device of claim 17, wherein the substrate contact is between the first bias pad and the second bias pad.

19. The semiconductor device of claim 17, wherein the substrate contact is electrically separated from the first bias pad and from the second bias pad by the first DTI.

20. The semiconductor device of claim 16, further comprising:
- a third bias pad within the buried oxide layer, wherein the first bias pad is between the third bias pad and the second bias pad; and
- a second bias contact extending through the semiconductor layer and partially through the buried oxide layer, wherein the second bias contact is electrically connected to the third bias pad.

* * * * *